United States Patent
Kim et al.

(10) Patent No.: US 8,431,032 B2
(45) Date of Patent: Apr. 30, 2013

(54) METHOD FOR CONTINUAL PREPARATION OF POLYCRYSTALLINE SILICON USING A FLUIDIZED BED REACTOR

(75) Inventors: Hee Young Kim, Daejeon (KR); Kyung Koo Yoon, Daejeon (KR); Yong Ki Park, Daejeon (KR); Won Choon Choi, Daejeon (KR)

(73) Assignee: Korea Research Institute of Chemical Technology, Daejeon (KR)

( * ) Notice: Subject to any disclaimer, the term of this patent is extended or adjusted under 35 U.S.C. 154(b) by 303 days.

(21) Appl. No.: 12/609,330

(22) Filed: Oct. 30, 2009

(65) Prior Publication Data

US 2010/0044342 A1 Feb. 25, 2010

Related U.S. Application Data

(63) Continuation of application No. 12/281,041, filed as application No. PCT/KR2007/002880 on Jun. 14, 2007.

(30) Foreign Application Priority Data

Jun. 15, 2006 (KR) .................. 10-2006-0053826

(51) Int. Cl.
*B44C 1/22* (2006.01)
(52) U.S. Cl.
USPC ............. 216/37; 216/67; 438/484; 438/687; 438/723

(58) Field of Classification Search .................. 216/37, 216/67; 438/687, 484, 723
See application file for complete search history.

(56) References Cited

U.S. PATENT DOCUMENTS

| | | | |
|---|---|---|---|
| 4,786,477 A | 11/1988 | Yoon et al. | |
| 4,900,411 A | 2/1990 | Poong et al. | |
| 5,139,762 A | 8/1992 | Flagella | |
| 5,491,967 A * | 2/1996 | Isaksson | 60/779 |
| 5,810,934 A | 9/1998 | Lord et al. | |
| 6,541,377 B2 | 4/2003 | Kim et al. | |
| 2002/0081250 A1* | 6/2002 | Lord | 422/198 |
| 2002/0102850 A1* | 8/2002 | Kim et al. | 438/687 |

* cited by examiner

*Primary Examiner* — Lan Vinh
*Assistant Examiner* — Maki Angadi
(74) *Attorney, Agent, or Firm* — Frommer Lawrence & Haug LLP; Ronald R. Santucci

(57) ABSTRACT

There is provided a method for continual preparation of granular polycrystalline silicon using a fluidized bed reactor, enabling a stable, long-term operation of the reactor by effective removal of silicon deposit accumulated on the inner wall of the reactor tube. The method comprises (i) a silicon particle preparation step, wherein silicon deposition occurs on the surface of the silicon particles, while silicon deposit is accumulated on the inner wall of the reactor tube encompassing the reaction zone; (ii) a silicon particle partial discharging step, wherein a part of the silicon particles remaining inside the reactor tube is discharged out of the fluidized bed reactor so that the height of the bed of the silicon particles does not exceed the height of the reaction gas outlet; and (iii) a silicon deposit removal step, wherein the silicon deposit is removed by supplying an etching gas into the reaction zone.

19 Claims, 7 Drawing Sheets

US 8,431,032 B2

METHOD FOR CONTINUAL PREPARATION OF POLYCRYSTALLINE SILICON USING A FLUIDIZED BED REACTOR

CROSS-REFERENCE TO RELATED APPLICATIONS

This application is a continuation of U.S. patent application Ser. No. 12/281,041 filed Aug. 28, 2008 entitled "Method for Continual Preparation of Polycrystalline Silicon Using a Fluidized Bed Reactor" which is a 371 application of PCT/KR2007/002880 filed Jun. 14, 2007 and which claims priority benefits of Korean Application Number 10-2006-0053826 filed Jun. 15, 2006, the disclosures of all applications of which are incorporated herein by reference.

TECHNICAL FIELD

The present invention relates to a method for preparation of polycrystalline silicon using a fluidized bed reactor, particularly to a method for continual preparation of polycrystalline silicon enabling effective removal of silicon deposit accumulated on the inner wall of the reactor tube of a polycrystalline silicon (multicrystalline silicon, polysilicon or poly-Si) manufacturing apparatus.

BACKGROUND ART

High purity polycrystalline silicon is widely used as a chemical or an industrial source material in semiconductor devices, solar cells, etc. Also, it is used in manufacturing precision functional devices and small-sized, highly-integrated precision systems. The polycrystalline silicon is prepared by thermal decomposition and/or hydrogen reduction of highly-purified silicon-containing reaction gas, thus causing a continuous silicon deposition on silicon particles.

In commercial-scale production of polycrystalline silicon, a bell-jar type reactor has been mainly used. Polycrystalline silicon products produced using the bell-jar type reactor is rod-shaped and has a diameter of about 50-300 mm. However, the bell-jar type reactor, which consists fundamentally of the electric resistance heating system, cannot be operated continuously due to inevitable limit in extending the maximum rod diameter achievable. This reactor is also known to have serious problems of low deposition efficiency and high electrical energy consumption because of limited silicon surfaces and high heat loss.

To solve these problems, there was developed recently a silicon deposition process using a fluidized bed reactor to produce polycrystalline silicon in the form of particles having a size of about 0.5-3 mm. According to this method, a fluidized bed of silicon particles is formed by the upward flow of gas and the size of the silicon particles increases as the silicon atoms deposit on the particles from the silicon-containing reaction gas supplied to the heated fluidized bed.

As in the conventional bell-jar type reactor, a Si—H—Cl-based silane compound, e.g., monosilane ($SiH_4$), dichlorosilane ($SiH_2Cl_2$), trichlorosilane ($SiHCl_3$), silicon tetrachloride ($SiCl_4$) or a mixture thereof is used in the fluidized bed reactor as the silicon-containing reaction gas, which can further comprise at least one gas component selected from hydrogen, nitrogen, argon, helium, etc.

For the silicon deposition to prepare polycrystalline silicon, the reaction temperature, or the temperature of silicon particles, should be maintained at about 600-850° C. for monosilane, while being about 900-1,100° C. for trichlorosilane which is most widely used.

The process of silicon deposition, which is caused by thermal decomposition and/or hydrogen reduction of silicon-containing reaction gas, includes various elementary reactions, and there are complex routes where silicon atoms grow into granular particles depending on the reaction gas. However, regardless of the kind of the elementary reactions and the reaction gas, the operation of the fluidized bed reactor yields polycrystalline silicon product in the form of particles, that is, granules.

Here, smaller silicon particles, i.e., seed crystals become bigger in size due to continuous silicon deposition or the agglomeration of silicon particles, thereby losing fluidity and ultimately being moved downwards. The seed crystals may be prepared or generated in situ in the fluidized bed itself, or supplied into the reactor continuously, periodically or intermittently. Thus prepared bigger particles, i.e., polycrystalline silicon product may be discharged from the lower part of the reactor continuously, periodically or intermittently.

Due to the relatively high surface area of the silicon particles, the fluidized bed reactor system provides a higher reaction yield than that by the bell-jar type reactor system. Further, the granular product may be directly used without further processing for the follow-up processes such as single crystal growth, crystal block production, surface treatment and modification, preparation of chemical material for reaction or separation, or shaped body or pulverization of silicon particles. Although these follow-up processes have been operated in a batchwise manner, the manufacture of the granular polycrystalline silicon allows the processes to be performed in a semi-continuous or continuous manner.

The biggest stumbling block in continuous production of particle-shaped, i.e., granular polycrystalline silicon using a fluidized bed reactor is that silicon deposition by the reaction gas occurs not only on the surfaces of the silicon particles heated to a high temperature but also on the surfaces of the reactor components that are inevitably exposed to or in contact with the hot silicon particles.

Silicon deposition occurs and is accumulated on the hot solid surfaces inside the fluidized bed reactor, including the silicon particles, the inner wall of the reactor tube and the reaction gas supplying means, all of which are exposed to the reaction gas. The thickness of the accumulated deposition layer increases with time. Here, it beneficially conforms to the purpose of the fluidized-bed deposition process that the thickness of the silicon deposition layer gradually increases on the surfaces of the silicon seed crystals or silicon particles. It is however disastrous when silicon deposition exceeds an allowable level at the solid surfaces of the reactor components, except for the silicon particles, including the inner wall of the reactor tube and/or the reaction gas supplying means exposed to or in contact with the high-temperature fluidizing silicon particles. If silicon deposition on such reactor components exceeds the allowed extent of mass or thickness, they should be greatly deteriorated in mechanical stability and, in the long run, the operation of the reactor has to be stopped.

For economical production of particle-shaped, i.e., granular polycrystalline silicon, improvement of the productivity of the fluidized bed reactor is essential. Further, for continuous operation of the fluidized bed reactor, which is the primary advantage of the fluidized-bed silicon deposition process, physical stability of the reactor components should be secured most of all. Thus, in order to improve the productivity of the fluidized bed reactor and secure the mechanical stability of the reactor during the silicon deposition process for preparing polycrystalline silicon particles, it is required to effectively remove the silicon deposit which is formed at the reactor components due to their constant exposure to and contact with the hot silicon particles and the reaction gas. Such an effective removal of the silicon deposit is more important in bulk production of polycrystalline silicon particles using a fluidized bed reactor. But, there are only a few techniques related to this.

U.S. Pat. No. 5,358,603 (1994) discloses a method for removing by an etching method the silicon deposit formed specifically on the product discharging means of the fluidized bed reactor during the fluidized-bed silicon deposition process. This method using an etching gas may also be applied to the removal of the silicon deposit formed at the inner wall of the reactor tube. However, application of this method basically requires following steps: first the deposition operation should be stopped; all the silicon particles within the fluidized bed should be discharged out of the reactor; then a heating means should be inserted into the reactor to heat up the silicon deposit for an etching reaction, etc. Such cumbersome and time-consuming steps limit the application of this method to the fluidized-bed deposition process.

U.S. Pat. No. 6,541,377 (2003) discloses a method of preventing silicon deposition on the outlet surface of the reaction gas supplying means or removing the silicon deposit formed thereon during deposition operation, wherein such objects are achieved by supplying an etching gas including hydrogen chloride without interfering with the supply of the reaction gas. This method can solve the problem of silicon deposition at the outlet of the reaction gas supplying means without affecting the operation of the silicon deposition process. However, since the etching gas is selectively supplied near the outlet of the reaction gas supplying means, the method cannot be applied for removing the silicon deposit formed and accumulated on the inner wall of the reactor tube.

U.S. Pat. No. 4,900,411 (1990) and U.S. Pat. No. 4,786,477 (1988) disclose a method of preventing silicon deposit from accumulating at the gas supplying means and at the inner wall of the reactor tube by circulating a cooling fluid around the corresponding components. However, since an excessive cooling of such reactor components in continuous contact with hot silicon particles consumes unnecessarily a huge amount of energy, this method is economically unfavorable considering an additional facility investment and a high production cost due to heavy energy consumption for heating silicon particles compensating the energy loss.

Different from other materials used in general chemical processes, the components of the fluidized bed reactor for preparing high purity polycrystalline silicon, especially, the reactor tube in contact with the silicon particles should be employed such that an impurity contamination of them should be avoided to the highest degree possible. Therefore, selection of the material for the reactor tube is much restricted. Due to the high reaction temperature and the characteristic of the reaction gas, metallic materials cannot be used for the reactor tube. Meanwhile, it is very difficult, in practice, to find a non-metallic, inorganic material that can prevent the impurity contamination of the silicon particles and ensure sufficient mechanical stability even when the silicon deposit becomes heavily accumulated at its inner wall.

The reactor tube of the fluidized bed reactor for preparation of polycrystalline silicon, which is in incessant contact with hot, fluidizing silicon particles, is vulnerable to irregular vibration and severe stress. Thus, it is very dangerous to continue silicon deposition if the thickness of the silicon deposit on the inner wall of the reactor tube exceeds an allowed value.

When removing by a chemical reaction or an etching reaction the silicon deposit formed and accumulated on the inner wall of the reactor tube during the silicon deposition for preparation of silicon particles, a large portion of the silicon particles fluidizing inside the reactor tube can also be removed together. That is, selective removal of the silicon deposit is almost impossible. Thus, it is the common practice to stop the silicon deposition, cool the inside of the reactor while purging with such an inert gas as hydrogen, nitrogen, argon, helium or a mixture thereof, discharge or withdraw the cooled silicon particles out of the reactor, disassemble the reactor and replace the reactor tube with a new one, reassemble the reactor, fill silicon particles into the reactor tube, heat the silicon particles sufficiently and supply the reaction gas again to resume the preparation of silicon particles. However, much is needed for the disassembling and reassembling of the fluidized bed reactor. In addition, the reactor tube tends to break when the reactor is cooled because of the difference in the degree of thermal expansion of the silicon deposit and the reactor tube material. Consequently, the silicon particles remaining inside the reactor tube are contaminated and the fragments of the reactor tube make the process of disassembling difficult.

Because the silicon deposit accumulated on the inner wall of the reactor tube reduces the productivity of the fluidized bed reactor and increases the production cost, a solution for this problem is needed.

DISCLOSURE OF THE INVENTION

Figure 1:
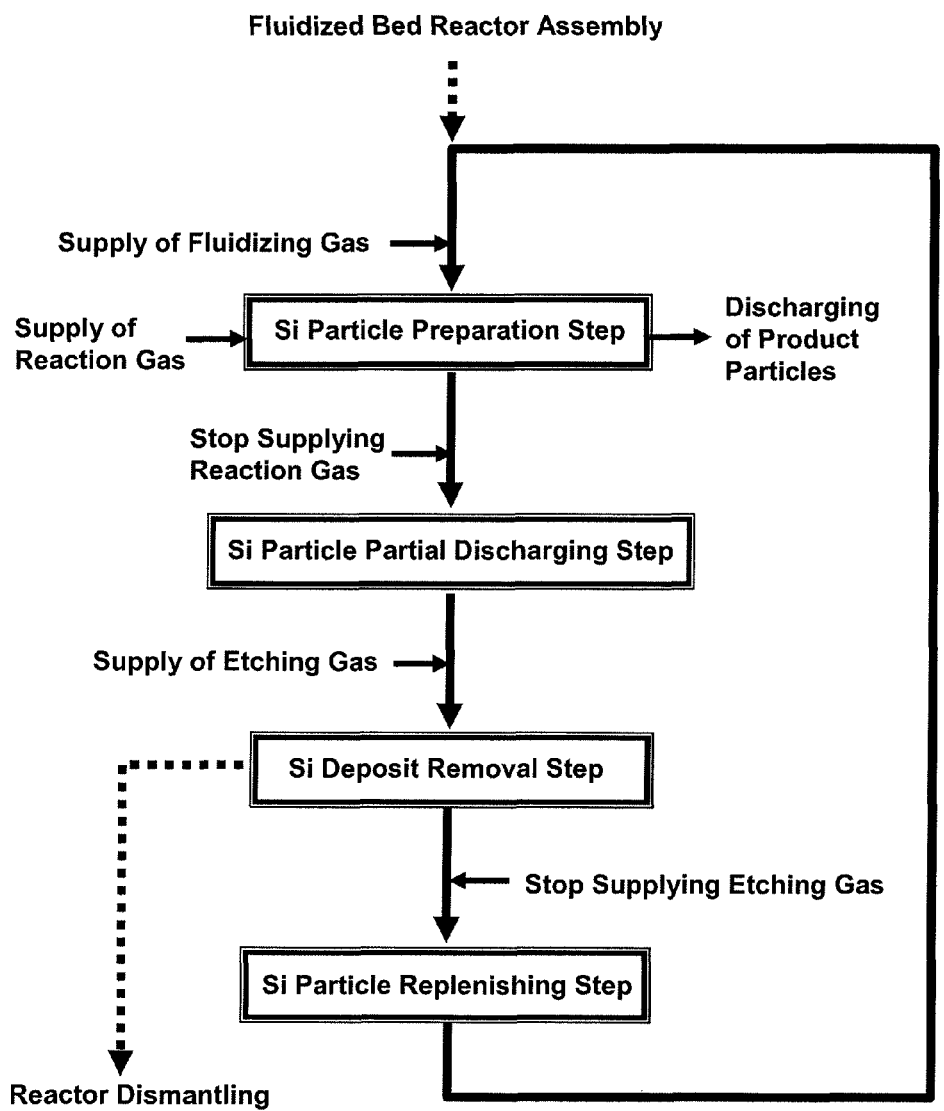
FIG. 1 schematically illustrates the method for preparing granular polycrystalline silicon in accordance with the present invention.

An object of the present invention is to provide a method for continual preparation of polycrystalline silicon enabling effective removal of silicon deposit formed on the inner wall of the reactor tube of the fluidized bed reactor during the preparation of granular polycrystalline silicon, and thus, enabling a stable, long-term operation of the fluidized bed reactor.

Hereunder is given a detailed description of the present invention.

To attain the afore-mentioned object, the present invention provides a method for preparation of polycrystalline silicon using a fluidized bed reactor for preparation of granular polycrystalline silicon, in which a reaction gas outlet of a reaction gas supplying means, that supplies a silicon-containing reaction gas so that silicon deposition may occur while the bed of silicon particles formed inside a reactor tube remains fluidized, is located inside of the bed of silicon particles and, with the outlet end as the reference height, the upper and lower spaces in the reactor tube are respectively defined as a reaction zone provided for silicon deposition by the reaction gas and a heating zone provided for heating the silicon particles, and which comprises:

(i) a silicon particle preparation step, wherein the reaction gas is supplied by the reaction gas supplying means so that silicon deposition occurs on the surface of the silicon particles in contact with the reaction gas, while silicon deposit is accumulated on the inner wall of the reactor tube encompassing the reaction zone;

(ii) a silicon particle partial discharging step, wherein, without requiring the supply of the reaction gas, a part of the silicon particles remaining inside the reactor tube is discharged out of the fluidized bed reactor so that the height of the bed of the silicon particles does not exceed the height of the outlet; and (iii) a silicon deposit removal step, wherein the silicon deposit is removed by supplying an etching gas into the reaction zone, which reacts with the silicon deposit to form gaseous silicon compounds.

The present invention also relates to a method for preparation of polycrystalline silicon which further comprises (iv) a silicon particle replenishing step, wherein, after removing the silicon deposit and terminating the supply of the etching gas, silicon particles are replenished into the reactor tube to form a bed of silicon particles in the reaction zone.

The present invention also relates to a method for preparation of polycrystalline silicon wherein the cycle comprising the steps (i), (ii), (iii) and (iv) is repeated.

The present invention also relates to a method for preparation of polycrystalline silicon in which the fluidized bed reactor comprises a reactor shell which encompasses the reactor tube, and the inner space of the reactor tube is defined as an inner zone where the bed of silicon particles is present and the heating zone and the reaction zone are included, while the space between the reactor tube and the reactor shell is defined as an outer zone where the bed of silicon particles is not present and silicon deposition does not occur.

The present invention also relates to a method for preparation of polycrystalline silicon in which (i) the silicon particle preparation step comprises the sub-steps of:

supplying a fluidizing gas to the bed of silicon particles in the heating zone using a fluidizing gas supplying means so that the bed of silicon particles formed in the reaction zone becomes fluidized;

heating the silicon particles with a heating means equipped at the inner zone and/or the outer zone of the reactor tube;

discharging a part of the silicon particles prepared in the inner zone out of the fluidized bed reactor using a particle discharging means; and discharging an off-gas gas comprising the fluidizing gas, which passes through the bed of silicon particles, a non-reacted reaction gas and a byproduct gas out of the fluidized bed reactor using a gas discharging means.

The present invention also relates to a method for preparation of polycrystalline silicon in which an inert gas comprising at least one selected from nitrogen, argon and helium is supplied to the outer zone in order to maintain the outer zone under an inert gas atmosphere.

The present invention also relates to a method for preparation of polycrystalline silicon in which the difference of the pressure at the outer zone ($P_o$) and the pressure at the inner zone ($P_i$) is maintained satisfying the condition of 0 bar $\leq |Po-Pi| \leq 1$ bar.

The present invention also relates to a method for preparation of polycrystalline silicon in which the etching gas comprises at least one chlorine-containing substance selected from silicon tetrachloride ($SiCl_4$), hydrogen chloride (HCl) and chlorine ($Cl_2$).

The present invention also relates to a method for preparation of polycrystalline silicon in which the etching gas further comprises at least one substance selected from hydrogen, nitrogen, argon and helium.

The present invention also relates to a method for preparation of polycrystalline silicon in which, in (i) the silicon particle preparation step and/or (iii) the silicon deposit removal step, the absolute pressure at the reaction zone is maintained at in the range of 1-20 bar.

The present invention also relates to a method for preparation of polycrystalline silicon in which (iii) the silicon deposit removal step comprises the sub-step of removing the silicon deposit formed at the reaction gas outlet of the reaction gas supplying means using the etching gas.

The present invention also relates to a method for preparation of polycrystalline silicon in which (iii) the silicon deposit removal step is carried out by supplying the etching gas using the reaction gas supplying means and/or an etching gas supplying means the outlet of which is exposed to the reaction zone.

The present invention also relates to a method for preparation of polycrystalline silicon in which, in (iii) the silicon deposit removal step, a fluidizing gas is supplied to the bed of silicon particles remained in the heating zone using a fluidizing gas supplying means so that the bed of the silicon particles is maintained as a fixed bed in which the particles become immobile or as a fluidized bed in which a part of the particles remains fluidized.

The present invention also relates to a method for preparation of polycrystalline silicon in which the fluidizing gas comprises at least one substance selected from hydrogen, nitrogen, argon, helium, silicon tetrachloride, trichlorosilane, dichlorosilane and hydrogen chloride.

The present invention also relates to a method for preparation of polycrystalline silicon in which a fixed bed of packing materials that are not fluidized by the fluidizing gas is formed in addition to the bed of silicon particles at the lower space of the heating zone.

The present invention also relates to a method for preparation of polycrystalline silicon in which, in (iii) the silicon deposit removal step, an etching-step off-gas including the fluidizing gas being passed through the bed of silicon particles, a non-reacted etching gas and/or an etching reaction product gas is discharged out of the fluidized bed reactor using a gas discharging means.

The present invention also relates to a method for preparation of polycrystalline silicon in which the reaction gas comprises at least one silicon-containing substance selected from monosilane ($SiH_4$), dichlorosilane ($SiH_2Cl_2$), trichlorosilane ($SiHCl_3$) and silicon tetrachloride ($SiCl_4$).

The present invention also relates to a method for preparation of polycrystalline silicon in which, in (iii) the silicon deposit removal step, the temperature of a part of the silicon deposit is maintained within the range of 500~1,250° C.

The present invention also relates to a method for preparation of polycrystalline silicon in which, in (iii) the silicon deposit removal step, the silicon deposit is heated by a heating means equipped at the inner zone of the reactor tube and/or at the outer zone.

Hereinafter, the present invention is described in detail referring to the appended drawings.

Figure 2:
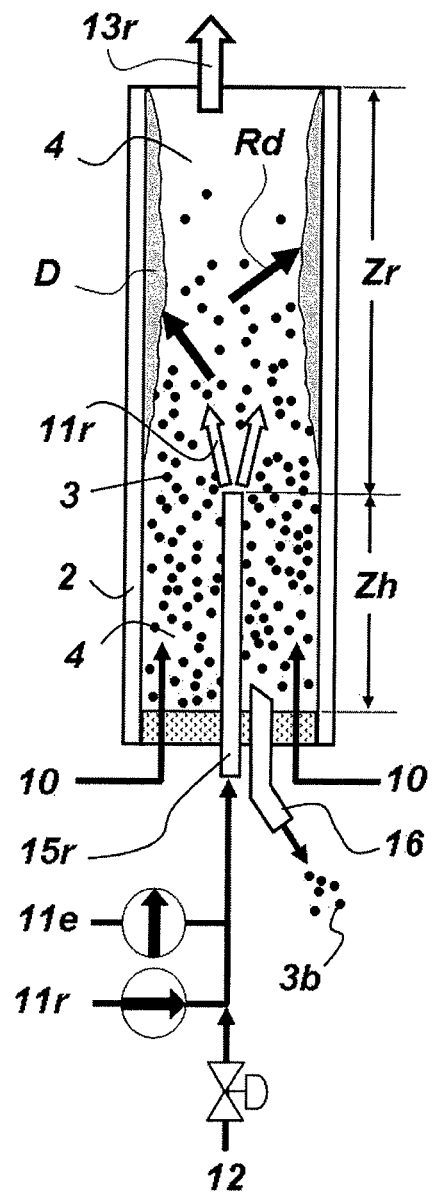
FIG. 2 schematically illustrates the silicon particle preparation step of the present invention.

As schematically illustrated in FIG. 2, in the preparation of granular polycrystalline silicon using a fluidized bed reactor, the fluidized bed of silicon particles should be formed inside a reactor tube capable of minimizing impurity contamination for preparation of high purity silicon particles.

Including thermal decomposition and/or hydrogen reduction of the silicon-containing reaction gas (11r), silicon deposition reaction (Rd) occurs not only on the surface of hot silicon particles (3) in contact with the reaction gas (11r) but also, inevitably, on the inner wall of the reactor tube (2).

In the fluidized bed reactor of the present invention as illustrated in FIG. 2, a reaction gas outlet of a reaction gas supplying means (15r), that supplies a silicon-containing reaction gas (11r) so that silicon deposition may occur while the bed of silicon particles (3) formed inside a reactor tube (2) remains fluidized, is located inside of the bed of silicon particles (3) and, with the outlet end as the reference height, the upper and lower spaces in the reactor tube are respectively defined as a reaction zone ($Z_r$) provided for the silicon deposition reaction (Rd) by the reaction gas and a heating zone (Zh) provided for heating the silicon particles (3).

During a silicon preparation step in such a fluidized bed reactor, the reaction gas (11r) is supplied through the reaction gas supplying means (15r), silicon deposition occurs on the surface of the silicon particles (3) in contact with the reaction gas (11r). Here, silicon deposition also occurs at the reactor components encompassing the reaction zone ($Z_r$), i.e., on the inner wall of the reactor tube (2) and/or on the surface of the reaction gas outlet of the reaction gas supplying means (15r). The thickness of the silicon deposit (D) increases with time, and then the inner diameter of the reaction zone ($Z_r$) decreases thereby.

As a result, the structural stability of the reactor tube (2) is deteriorated greatly as it is exposed to the fluidization of hot silicon particles (3). Thus, if the thickness of the silicon deposit (D) exceeds a predetermined allowable value, preparation of silicon particles by the silicon deposition reaction (Rd) should be interrupted by terminating the supply of the reaction gas (11r).

When the diameter of the reactor tube (2) of a fluidized bed reactor is increased, the ratio of the area of the inner wall to the inner space volume becomes significantly lowered, resulting in slower accumulation of the silicon deposit (D) by silicon deposition ($R_d$). Consequently, it takes longer for the thickness of the silicon deposit (D) to reach an allowable maximum value. Thus, for large-scale fluidized bed reactors used for commercial-scale production, the silicon particle preparation step can be sustained for from a few days to several weeks.

When the thickness of the silicon deposit (D) reaches near the allowed maximum value, the operation of silicon deposition is required to be stopped. It is conventional that, after the inside of the reactor is cooled down sufficiently by purging with an inert gas such as hydrogen, nitrogen, argon, helium, etc., all the cooled silicon particles (3) are discharged out of the reactor, the reactor is disassembled, the reactor tube (2) is replaced with a new one, and then the reactor is reassembled for another silicon particles preparation step. On the contrary, the present invention makes it possible to resume silicon deposition after removing the silicon deposit (D) without the need of disassembling the fluidized bed reactor.

In accordance with the present invention, the silicon particles preparation step is followed by a silicon particle partial discharging step, wherein, without requiring the supply of the reaction gas (11r), a part of the silicon particles (3) remaining inside the reactor tube is discharged out of the fluidized bed reactor so that the height of the bed of the residual silicon particles (3) within the reactor tube does not substantially exceed the height of the reaction gas outlet of the reaction gas supplying means (15r).

Figure 3:
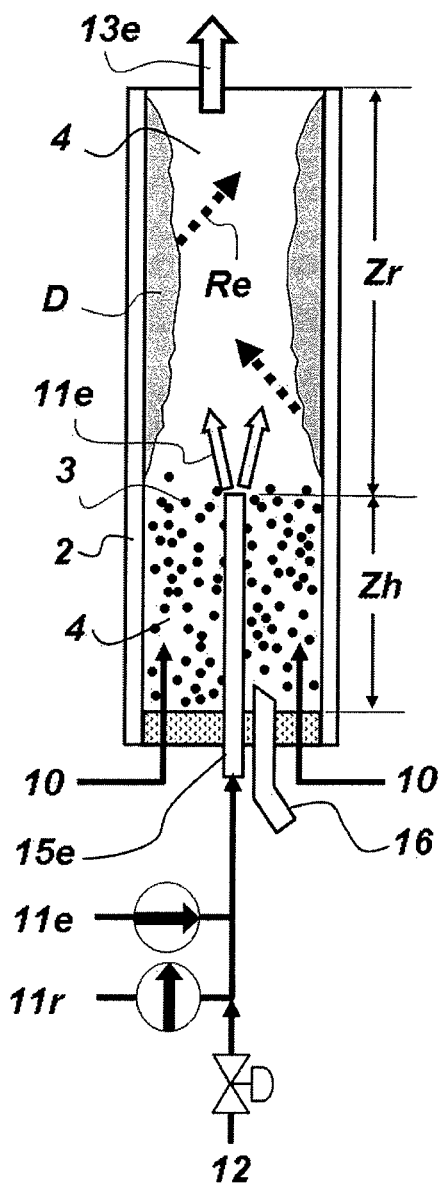
FIG. 3 schematically illustrates the silicon deposit removal step of the present invention.
Figure 5:
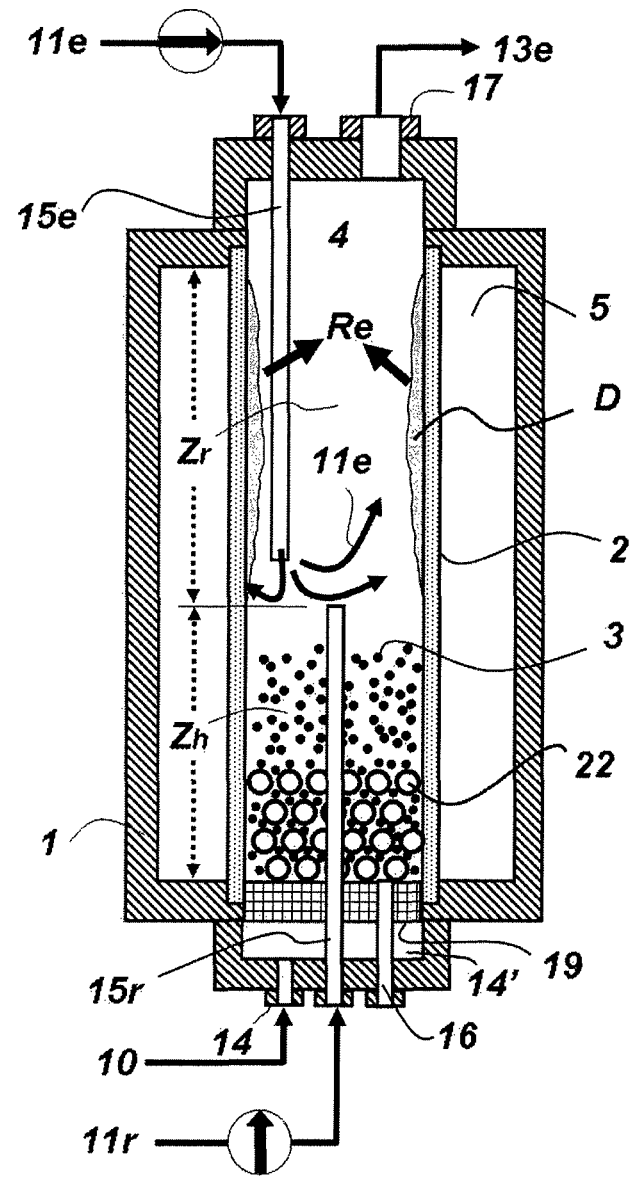
FIG. 5 schematically illustrates another example of the silicon deposit removal step of the present invention.

Subsequently a silicon deposit removal step follows the silicon particle partial discharging step. As illustrated in FIG. 3 or FIG. 5, an etching gas (11e) which is capable of reacting with the silicon deposit (D) and forming gaseous silicon compounds is supplied into the space of the reaction zone ($Z_r$), where the bed of silicon particles has been substantially removed, to effectively remove the silicon deposit (D) by etching reaction ($R_e$). In this silicon deposit removal step, the silicon deposit (D) accumulated on the inner wall of the reactor tube (2) is removed, while the silicon deposit (D') accumulated on the surface of the reaction gas outlet of the reaction gas supplying means (15r) may also be removed by its natural contact with the etching gas (11e) introduced.

As described hereinbefore, the reaction gas outlet of the reaction gas supplying means (15r), which supplies the silicon-containing reaction gas (11r), is located inside of the bed of silicon particles (3) during the silicon particles preparation step, so that silicon deposition may occur in the fluidized bed of silicon particles (3) inside the reactor tube (2). With the outlet end as the reference height, the upper and lower spaces in the reactor tube (2) are respectively defined as a reaction zone ($Z_r$) provided for silicon deposition reaction (Rd) by the reaction gas (11r) and a heating zone (Zh) provided for heating the silicon particles (3).

It is preferred that the silicon particle preparation step, in which silicon product particles are prepared by silicon deposition on the surface of the silicon particles (3) in contact with the reaction gas (11r) supplied by the reaction gas supplying means (15r), can be sustained as long as possible in the fluidized bed reactor. However, inevitably in this step, the silicon deposit (D) is also formed and accumulated on the inner wall of the reactor tube (2) encompassing the reaction zone ($Z_r$).

In order to remove the silicon deposit (D), the present invention comprises a silicon particle partial discharging step in which, without requiring the supply of the reaction gas (11r), a part of the silicon particles (3) is discharged out of the fluidized bed reactor, so that the height of the bed of silicon particles (3) remaining inside the reactor tube (2) does not exceed the height of the outlet, and a silicon deposit removal step in which an etching gas (11e), that reacts with the silicon deposit (D) to form gaseous silicon compounds, is supplied into the space of the reaction zone ($Z_r$) for removing the silicon deposit (D).

Once the silicon deposit (D) accumulated on the inner wall of the reactor tube (2) is substantially removed with the etching gas via the silicon deposit removal step, it is no more necessary to supply the etching gas (11e) further.

After completion of the silicon deposit removal step and termination of the supply of the etching gas (11e), a silicon particle replenishing step follows in which silicon particles (3) substantially corresponding to the amount discharged out of the reactor during the silicon particle partial discharging step are replenished into the reactor tube (2) to form a bed of silicon particles (3) in the reaction zone ($Z_r$).

Then, the silicon particle preparation step, in which silicon deposition occurs on the surface of fluidized silicon particles (3) by supplying the reaction gas (11r) into the reaction zone ($Z_r$) using the reaction gas supplying means (15r), can be resumed.

To summarize, the present invention may ultimately provide a method for continual preparation of polycrystalline silicon following the sequential steps of: the step in which the reaction gas is supplied to the reaction zone ($Z_r$) of the reactor tube (2), so that silicon particles are prepared by silicon deposition on the surface of the silicon particles (3) while the silicon deposit (D) is accumulated; the step in which, without requiring the supply of the reaction gas, a part of the silicon particles is discharged out of the fluidized bed reactor; the step in which the etching gas is supplied into the reaction zone ($Z_r$) to remove the silicon deposit (D); and the step in which, after the supply of the etching gas is terminated, silicon particles are replenished to the reaction zone ($Z_r$) inside the reactor tube (2).

At a high temperature around the reaction temperature of the silicon deposition ($R_d$), the rate of the etching reaction ($R_e$) of the silicon deposit (D) with the etching gas (11e) becomes very high. Thus, the silicon deposit removal step may be completed very rapidly within from a few minutes to several hours.

Further, because the amount of the silicon particles to be discharged during the silicon particle partial discharging step is smaller than the total amount of the silicon particles residing in the reactor tube (2) during the silicon particle preparation step, the time required for the silicon deposit removal step and the silicon particle replenishing step is very short as compared with that required for the silicon particle preparation step and is of little burden to the productivity of the reactor.

In accordance with the present invention, which offers a method for removing the silicon deposit (D) during the preparation of polycrystalline silicon particles, it is possible to prepare silicon particles by repeating the silicon deposition cycles with each cycle comprising: (i) the silicon particle preparation step, (ii) the silicon particle partial discharging step, (iii) the silicon deposit removal step and (iv) the silicon particle replenishing step, as summarized in FIG. 1. According to this process, the reactor needs not be disassembled and the reactor tube (2) can be continuously used although the silicon deposit (D) is accumulated on the inner wall of the reactor tube (2) or on other components of the reactor during the silicon particle preparation step. This is possible because the silicon deposit (D) can be removed quickly without the need of disassembling the fluidized bed reactor. Then, through the silicon particle replenishing step, it is also possible to execute silicon deposition cycles in a repeated manner by quickly resuming the silicon particle preparation step.

When a continual preparation of polycrystalline silicon particles is achieved by repeated silicon deposition cycles according to the present invention, it is possible to relieve greatly the inevitable problems such as the accumulation of silicon deposit (D) at the reactor components, the decreased reactor productivity resulting from the disassembly and reassembly of the fluidized bed reactor and the subsequent increase in production cost, thereby major advantages of preparing granular polycrystalline silicon by the fluidized bed deposition process being realized.

The reactor components that contact the hot silicon particles (4) and are exposed to the reaction gas (11r) during the silicon particle preparation step include such solid surfaces the inner wall of the reactor tube (2) and/or the reaction gas outlet of the reaction gas supplying means (15r). As the etching gas (11e) is supplied to the reaction zone ($Z_r$) during the silicon deposit removal step, not only the silicon deposit (D) accumulated on the inner wall of the reactor tube (2) but also the silicon deposit (D') accumulated at the reaction gas outlet of the reaction gas supplying means (15r) is exposed to the etching gas (11e) and removed by etching reaction ($R_e$). Thus, in accordance with the present invention, not only the silicon deposit (D) accumulated on the inner wall of the reactor tube (2) but also the silicon deposit (D') accumulated at the reaction gas outlet of the reaction gas supplying means (15r) can be removed by the etching gas (11e).

As described above, the present invention can be applied to any type of fluidized bed reactor in which the bed of the silicon particles (3) is divided into the reaction zone ($Z_r$) and the heating zone ($Z_h$), with the outlet end of the reaction gas supplying means (15r) being taken as the reference height. Thus, the present invention can be widely applied in the preparation of granular polycrystalline silicon.

Figure 4:
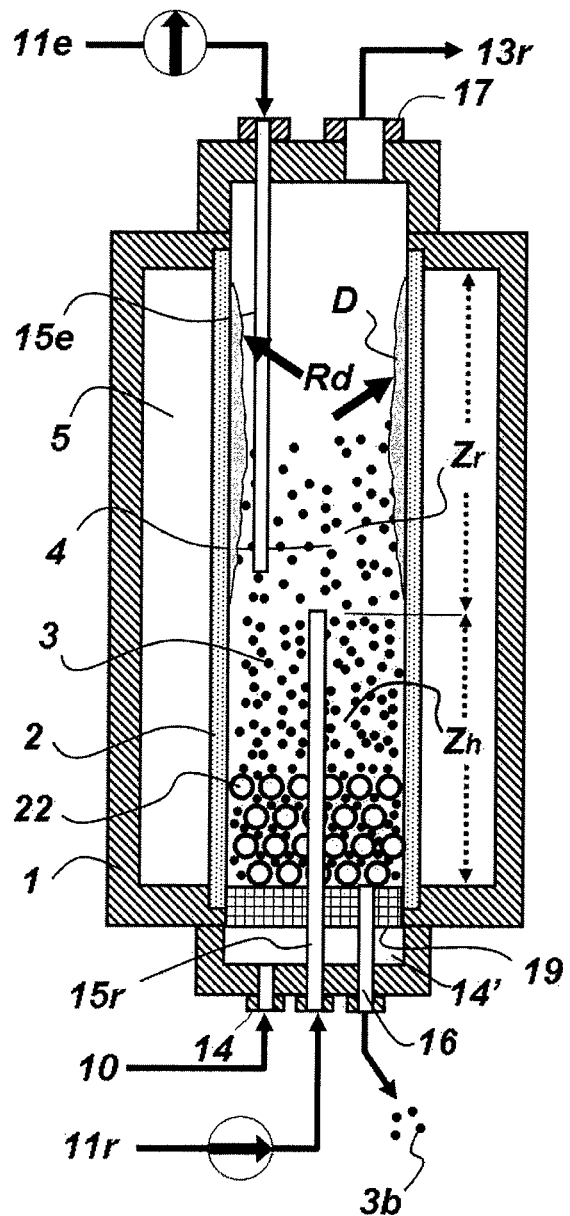
FIG. 4 schematically illustrates another example of the silicon particle preparation step of the present invention.

For example, as schematically illustrated in FIG. 4 and FIG. 5, a reactor tube (2) may be installed inside a reactor shell (1) having a superior mechanical strength, so that the reactor shell (1) encompasses the reactor tube (2). The inner space of the reactor tube (2) is defined as an inner zone (4) where the bed of silicon particles (3) is present. The inner zone (4) includes a heating zone ($Z_h$) and a reaction zone ($Z_r$). Meanwhile, the space between the reactor tube (2) and the reactor shell (1) is defined as an outer zone (5) where the bed of silicon particles is not present and silicon deposition reaction ($R_d$) does not occur.

The silicon particle preparation step executed using the fluidized bed reactor may comprise the sub-steps of: supplying a fluidizing gas (10) to the bed of silicon particles (3) in the heating zone ($Z_h$) using a fluidizing gas supplying means (14) so that the bed of silicon particles (3) formed in the reaction zone ($Z_r$) becomes fluidized; heating the silicon particles (3) with a heating means (8a, 8b) equipped at the inner zone (4) and/or the outer zone (5) of the reactor tube (2); discharging a part of the silicon particles (3b) prepared in the inner zone (4) out of the fluidized bed reactor using a particle discharging means (16); and discharging an off-gas (13r) comprising the fluidizing gas (10), which passes through the bed of silicon particles, a non-reacted reaction gas and a byproduct gas out of the fluidized bed reactor using a gas discharging means (17).

During the silicon deposit removal step, it is possible to remove the silicon deposit by supplying the etching gas (11e) to the reaction zone ($Z_r$) using a reaction gas supplying means (15r) and/or an etching gas supplying means (15e) the outlet of which is exposed to the reaction zone ($Z_r$). For example, the etching gas (11e) may be supplied to the reaction zone ($Z_r$) instead of the reaction gas (11r) using the reaction gas supplying means (15r) as an etching gas supplying means (15e), as schematically illustrated in FIG. 3, in order to carry out the silicon deposit removal step. In this case, the reaction gas supplying means (15r), i.e., the etching gas supplying means (15e) may be constructed such that the reaction gas (11r) and the etching gas (11e) can pass through the same route or nozzles, or such that the reaction gas (11r) and the etching gas (11e) can pass through different routes or nozzles. Alternatively, as schematically illustrated in FIG. 5, the etching gas (11e) may be supplied using an etching gas supplying means (15e) which is equipped independently of the reaction gas supplying means (15r) in the inner zone (4) of the fluidized bed reactor and the outlet of which is exposed to the reaction zone ($Z_r$). As an alternative, the silicon deposit removal step may be carried out by supplying the etching gas (11e) to reaction zone ($Z_r$) using both the reaction gas supplying means (15r) and the etching gas supplying means (15e).

The present invention is characterized in that the bed of silicon particles (3) is always present in part or whole of the heating zone ($Z_h$) inside the reactor tube (2) in all the steps comprised in each silicon deposition cycle, that is, (i) the silicon particle preparation step; (ii) the silicon particle partial discharging step; (iii) the silicon deposit removal step; and (iv) the silicon particle replenishing step.

During the silicon particle preparation step, it is required that the bed of silicon particles (3) be formed not only in the heating zone ($Z_h$) but also in the reaction zone ($Z_r$) and that the silicon particles (3) in the two zones can be mixed with each other while at least the silicon particles (3) present in the reaction zone ($Z_r$) remain fluidized, as schematically illustrated in FIG. 2 or FIG. 4.

The bed of the silicon particles (3) present in the heating zone ($Z_h$) may be a fixed bed, but it is preferred that a fluidizing gas (10) be supplied by a fluidizing gas supplying means (14) so that at least the particles present at the upper part of the heating zone ($Z_h$) remain fluidized for effective exchange of the silicon particles between the two zones ($Z_r$, $Z_h$).

During the silicon particle partial discharging step, the height of the bed of silicon particles (3) within the reactor tube (2) becomes lowered with time to or below the height of the reaction gas outlet of the reaction gas supplying means (15r). Although not necessary, an appropriate amount of the fluidizing gas (10) may be supplied for efficient discharge of the particles.

Fluidization of the silicon particles (3) as mentioned in the present description means the possibility of a change in the spatial position of the silicon particles with time caused by the flow of gas through the particles, the movement and evolution of gas bubbles, and/or the motion of neighboring particles.

During the silicon deposit removal step, the whole or part of the bed of silicon particles present in the heating zone ($Z_h$) may remain as fixed or partly fluidized by supplying the fluidizing gas (10) by the fluidizing gas supplying means (14).

And, during the silicon particle replenishing step, the whole or a part of the bed of silicon particles present in the heating zone ($Z_h$) may remain as fixed or partly fluidized by supplying the fluidizing gas (10) by the fluidizing gas supplying means (14).

Meanwhile, during the silicon deposit removal step, it is required that an etching-step off-gas (13e) comprising the fluidizing gas being passed through the bed of silicon particles (3) be remained, and a non-reacted etching gas and/or an etching reaction product gas be discharged out of the fluidized bed reactor using a gas discharging means (17) as schematically illustrated in FIG. 5.

Since the fluidizing gas (10) used in the whole or a part of the silicon deposition cycles in accordance with the present invention passes through the bed of silicon particles (3) residing in the heating zone ($Z_h$) as illustrated in FIGS. 2-7, it should be purified to avoid contamination of the silicon particles. Preferably, the fluidizing gas (10) is one not reacting with the silicon particles and is selected from hydrogen, nitrogen, argon and helium. The fluidizing gas (10) may further comprise a chlorine compound more dense and viscous than the non-reactive gas components, which may be obtained during the preparation of polycrystalline silicon or contained in the reaction byproduct gas, such as silicon tetrachloride ($SiCl_4$), trichlorosilane ($SiHCl_3$), dichlorosilane ($SiH_2Cl_2$), hydrogen chloride (HCl), etc. In case the chlorine compound is added to the non-reactive gas, it is required that the allowed content range of the chlorine compound be predetermined through thermodynamic balance analysis or a simple preliminary experiment, so that silicon deposition or silicon etching cannot occur in a detectable level between the high purity silicon particles (3), residing in the heating zone ($Z_h$), and the fluidizing gas (10). Thus, the fluidizing gas (10) used in the present invention may comprise at least one substance selected from hydrogen ($H_2$), nitrogen ($N_2$), argon (Ar), helium (He), silicon tetrachloride ($SiCl_4$), trichlorosilane ($SiHCl_3$), dichlorosilane ($SiH_2Cl_2$) and hydrogen chloride (HCl).

The fluidizing gas (10) mentioned in the present description represents a gas supplied by the fluidizing gas supplying means (14) into the bed of silicon particles (3) residing in the heating zone (Zh). As mentioned hereinbefore, the supply rate of the fluidizing gas (10) can be adjusted differently at each step of a silicon deposition cycle. Accordingly, the supply of the fluidizing gas (10) does not necessarily cause the fluidization of the silicon particles (3).

In order to form, at least in part, the fluidized bed of silicon particles (3) in the reaction zone ($Z_r$) and/or the heating zone ($Z_h$), a considerable amount of fluidizing gas (10) has to be supplied, and the load of the heating means (8a, 8b) for heating the gas increases accordingly. Thus, as schematically illustrated in FIG. 4 and FIG. 5, it is optional to construct the fluidized bed reactor such that a fixed bed, i.e., a packed bed of non-fluidizable packing materials (22) is formed in addition to the bed of silicon particles (3) at the lower part of the heating zone ($Z_h$), so that the supply of the fluidizing gas (10) per unit time may not become excessive. In order to form the fixed bed of the packing materials (22), it is required that the average unit weight of the packing materials be at least 5-10 times higher than that of the silicon particles, the fixed bed be not physically deformed by the movement or fluidization of the silicon particles (3) and the material be selected so that impurity contamination of the silicon particles (3) can be minimized. While the silicon deposition cycles are repeated, the packing materials (22) remain almost stationary without being moved along with the silicon particles (3) or discharged. Also, they can perform the function of a gas distributing means for distributing the fluidizing gas (10) more uniformly at the lower part of the heating zone ($Z_h$). Further, their surface can indirectly increase the heat transfer area of the heating means (8a) at the heating zone ($Z_h$) when they are installed together with a heating means (8a).

The reaction gas (11r) supplied to the reaction zone ($Z_r$) during the silicon particle preparation step should comprise a silicon-containing substance, so that silicon deposition may occur to yield granular polycrystalline silicon. The reaction gas (11r) may comprise at least one substance selected from monosilane ($SiH_4$), dichlorosilane ($SiH_2Cl_2$), trichlorosilane ($SiHCl_3$) and silicon tetrachloride ($SiCl_4$). The reaction gas (11r) may comprise only the afore-mentioned silicon deposition source material. However, it may further comprise at least one gas component selected from hydrogen, nitrogen, argon, helium and hydrogen chloride (HCl). In addition to supplying the source material for silicon deposition, the reaction gas (11r) contributes to the fluidization of the silicon particles (3) in the reaction zone ($Z_r$) together with the fluidizing gas (10).

The etching gas (11e), which is supplied to the reaction zone ($Z_r$) to remove the silicon deposit (D) by forming gaseous silicon compounds through its reaction with the silicon deposit (D) during the silicon deposit removal step, may comprise at least one chlorine-containing substance selected from silicon tetrachloride ($SiCl_4$), hydrogen chloride (HCl) and chlorine ($Cl_2$).

The etching reaction ($R_e$) triggered by the etching gas (11e) may comprise: (1) trichlorosilane formation from a mixture of silicon tetrachloride/silicon metal/hydrogen; (2) chlorosilane formation from a mixture of silicon metal/hydrogen chloride or silicon metal/hydrogen chloride/hydrogen; and/or (3) chlorosilane formation from a mixture of silicon metal/chlorine. Other than the chlorine-containing substance, there are many compounds that can remove the silicon deposit through their reaction with silicon. But, the chlorine-containing substance is preferred in the present invention to prevent any impurity contamination by limiting the chemical reactions involved in the repeated silicon deposition cycles within the Si—H—Cl system. The etching gas (11e) used in the present invention may comprise only the chlorine-containing substance. But, it may further comprise at least one substance selected from hydrogen, nitrogen, argon and helium. If the content of the chlorine-containing substance in the etching gas mixture comprising the diluent gas is too low, the rate of etching reaction decreases. Thus, it is preferred not to dilute the etching gas supplied in the silicon deposit removal step too much. For example, if hydrogen chloride is used as the chlorine-containing substance, it is preferred that the molar concentration of the diluent gas do not exceed about 2-3 times that of hydrogen chloride.

During the silicon particle preparation step, the reaction temperature for silicon deposition, or the temperature of the silicon particles, should be maintained high. While the reaction temperature for monosilane is about 600-850° C., the temperature for trichlorosilane, which is more widely used for commercial purpose, is as high as about 900-1,150° C.

During the silicon deposit removal step, it is preferred that the temperature of the part of the silicon deposit (D) be kept within the range of from 500 to 1,250° C. in order to significantly increase the rate of the etching reaction ($R_e$). At a temperature lower than 500° C., the etching reaction ($R_e$) of the silicon deposit (D) composed of high purity silicon does not begin very quickly. At a temperature higher than 1,250° C., the rate of the etching reaction ($R_e$) is very high, but it is highly likely that the wall of the reactor tube (2) covered by the silicon deposit (D) be physically damaged by the reaction heat generated. In order to reduce the time required for the etching reaction ($R_e$), it is preferred to heat the silicon deposit (D) using a heating means (8a, 8b) equipped at the inner zone (4) and/or the outer zone (5) during the silicon deposit removal step. Heating of the silicon deposit (D) using the heating means (8a, 8b) may be carried out not only directly by radiation heating, but also indirectly by the fluidizing gas (10), the etching gas (11e) and/or the bed of silicon particles (3) heated by the heating means (8a, 8b). Once part of the silicon deposit (D) is heated to 500-1,250° C., it is quickly removed by the etching reaction ($R_e$) with the etching gas (11e) and the remaining silicon deposit (D) may be heated in situ by the reaction heat of the etching reaction ($R_e$). Thus, it is not necessary to uniformly heat the whole deposit.

For large-scale production of polycrystalline silicon particles by repeating the silicon deposition cycles in accordance with the present invention, it is required to maximize the rate of silicon deposition in the fluidized bed reactor and the rate of etching reaction ($R_e$) of the silicon deposit (D). Thus, it is preferred that the absolute pressure in the reaction zone ($Z_r$) be maintained within 1-20 bar during the silicon particle preparation step and/or the silicon deposit removal step. If absolute pressure ($P_i$) in the reaction zone ($Z_r$) is lower than 1 bar, the rate of silicon deposition or etching reaction ($R_e$) is not high enough, making the process unproductive. In contrast, if it is higher than 20 bar, it is difficult to maintain the reaction temperature even when many heating means (8a, 8b) are installed in the inner space of the reactor shell (1) to heat the silicon particles (3). Thus, it is preferred that the absolute pressure ($P_i$) in the reaction zone ($Z_r$) be selected in the range of from about 1 to 20 bar.

Hereunder is given a detailed description of the construction of a fluidized bed reactor which may effectively carry out (i) the silicon particle preparation step; (ii) the silicon particle partial discharging step; (iii) the silicon deposit removal step; and (iv) the silicon particle replenishing step in accordance with the present invention and may improve the productivity in preparing polycrystalline silicon particles by repeating the silicon deposition cycles in a continual manner.

Figure 6:
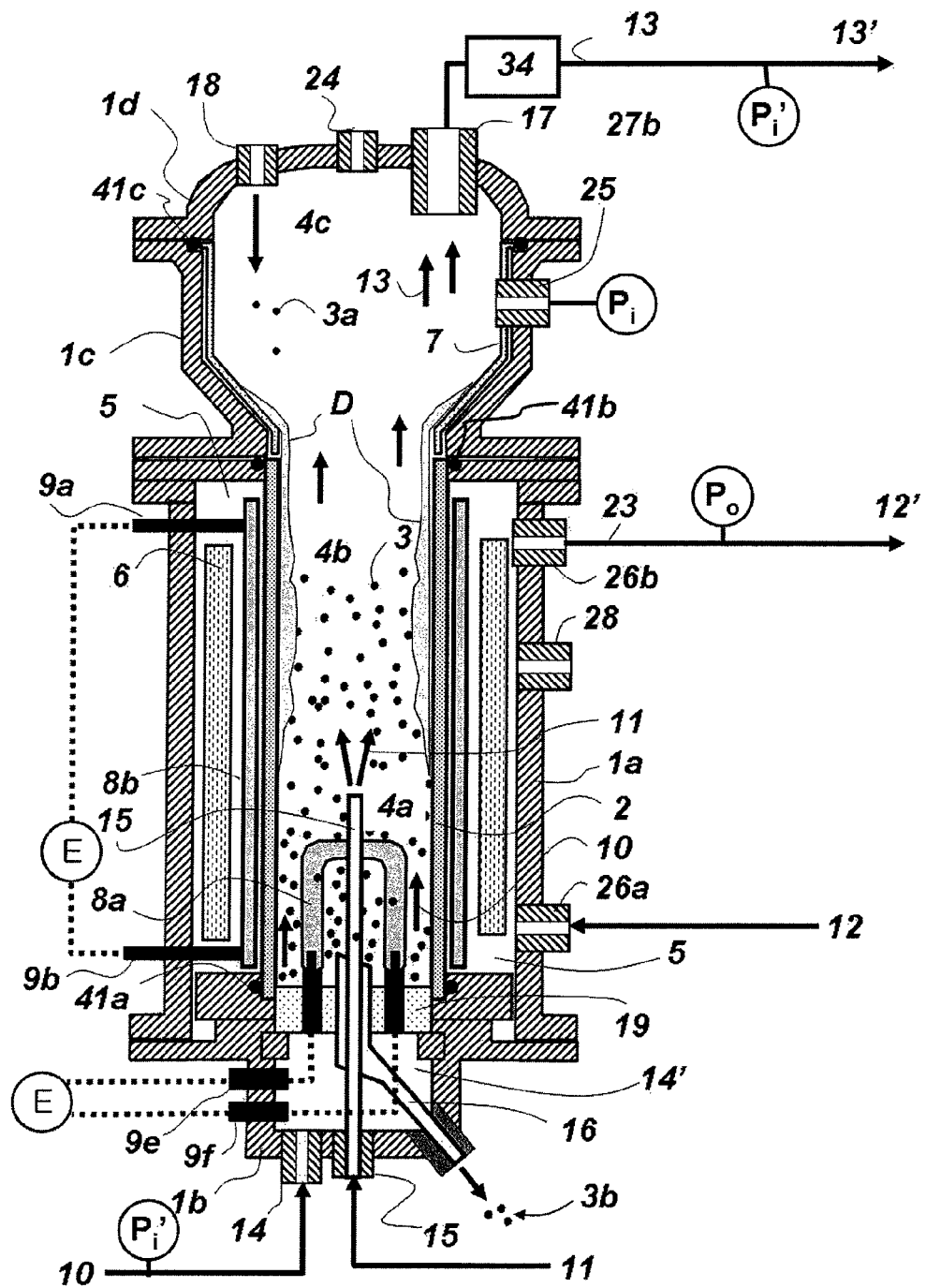
FIG. 6 schematically illustrates the various constructions of the fluidized bed reactor applicable to the preparation of granular polycrystalline silicon in accordance with the present invention.
Figure 7:
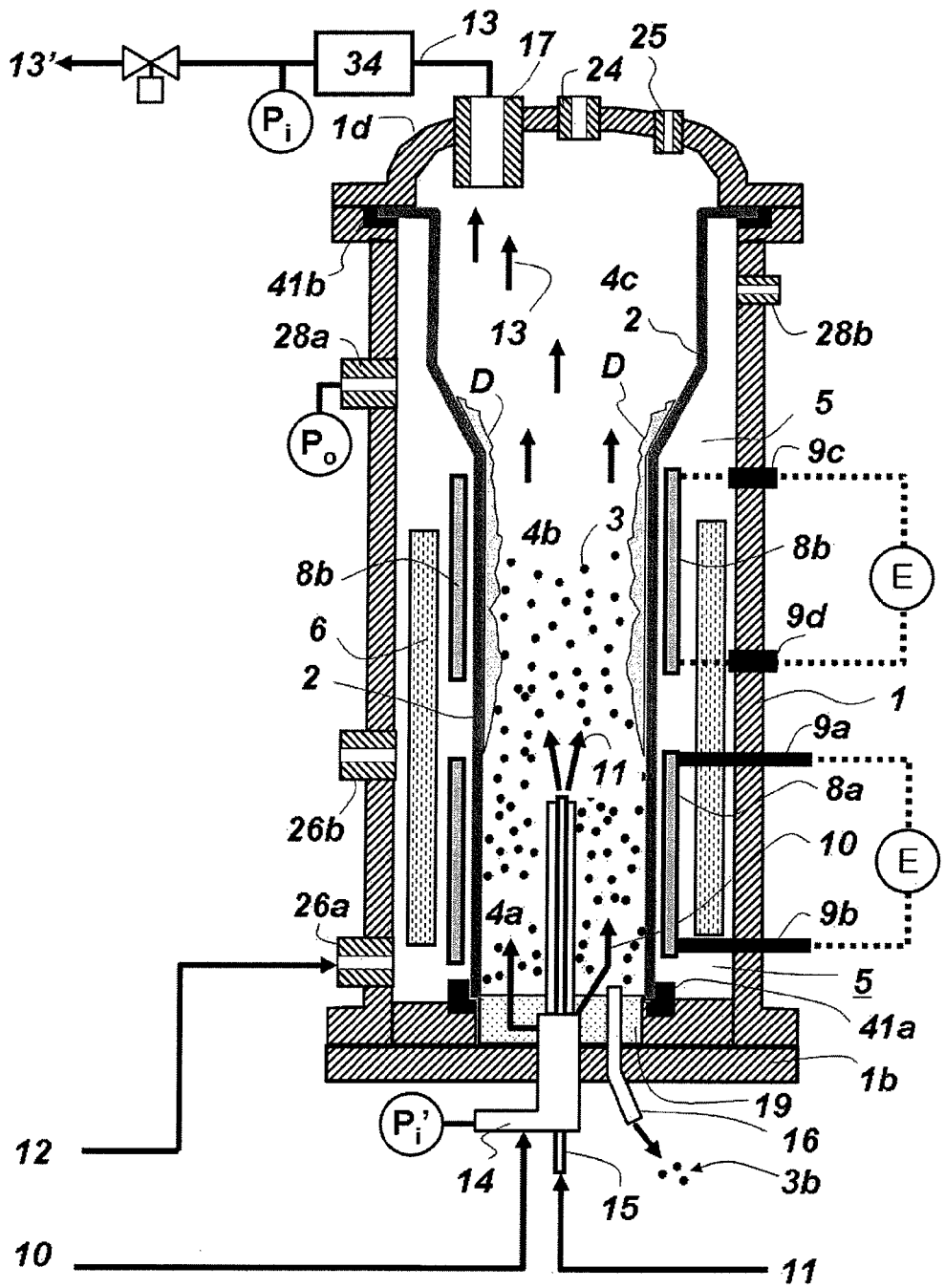
FIG. 7 schematically illustrates another various constructions of the fluidized bed reactor applicable to the preparation of granular polycrystalline silicon in accordance with the present invention.

Based on the silicon particle preparation step of the present invention, FIG. 6 and FIG. 7 illustrate respectively in a comprehensive way the schematics of the embodiments of a fluidized bed reactor that can be used to prepare granular polycrystalline silicon by repeating silicon deposition cycles.

The fluidized bed reactor that can be used for the present invention comprises a reactor tube (2) and a reactor shell (1). The inner space of the reactor is isolated from the outside of the reactor by the reactor shell (1). The reactor shell (1) encompasses the reactor tube (2) which is installed vertically in the inner space of the reactor. That is, the reactor tube (2) is installed vertically inside the reactor shell (1), so that the reactor shell (1) encompasses the reactor tube (2). The inner space of the reactor tube (2) is defined as an inner zone (4) in which the bed of silicon particles (3) is present and silicon deposition occurs. Further, the space between the reactor tube (2) and the reactor shell (1) is defined as an outer zone (5) in which the bed of silicon particles (3) is not present and silicon deposition does not occur.

The reactor shell (1) may be made of a metallic material with reliable mechanical strength and easy processability such as carbon steel, stainless steel or other alloy steels. As set forth in FIG. 6 and FIG. 7, the reactor shell (1) may be composed of several components (1a, 1b, 1c, 1d) for convenience in fabrication, assembly and disassembly.

It is important to assemble the components of the reactor shell (1) using gaskets or sealing materials made of a variety of materials in order to completely isolate the inside of the reactor from the outside. The components of the reactor shell (1) may be in the form of a cylindrical pipe, a flange, a tube with fittings, a plate, a cone, an ellipsoid or a double-wall jacket with a cooling medium flowing in between the walls, etc. The inner surface of each component may be coated with a protective layer or be additionally installed with a protective wall in the form of tube or shaped liner, which may be made of a metallic material or a non-metallic material such as organic polymer, ceramic or quartz, etc.

Some of the components of the reactor shell (1), illustrated as 1a, 1b, 1c and 1d in FIG. 6 and FIG. 7, are preferred to be maintained below a certain temperature by using a cooling medium such as water, oil, gas and air for protecting the equipment or operators, or for preventing any thermal expansion in equipment or a safety accident. Although not shown in FIG. 6 and FIG. 7, the components that need to be cooled are preferably designed to comprise a coolant-circulating means at their inner or outer walls. Alternatively, an insulation material may be equipped on the outer surface of the reactor shell (1) for protection of operators and prevention of excessive heat loss.

The reactor tube (2) may be of any shape only if it can be hold by the reactor shell (1) in such a manner that it can separate the inner space of the reactor shell (1) into an inner zone (4) and an outer zone (5). The reactor tube (2) may have the form of a simple straight tube as in FIG. 6, a shaped tube as in FIG. 7, a cone or an ellipsoid, and either one end or both ends of the reactor tube (2) may be formed into a flange shape. Further, the reactor tube (2) may comprise a plurality of components and some of these components may be installed in the form of a liner along the inner wall of the reactor shell (1).

The reactor tube (2) is preferably made of an inorganic material, which is stable at a relatively high temperature, such as quartz, silica, silicon nitride, boron nitride, silicon carbide, graphite, silicon, glassy carbon and composite material thereof. Here a carbon-containing material such as silicon carbide, graphite, glassy carbon, etc., may generate carbon impurity and contaminate the polycrystalline silicon particles. Thus, if the reactor tube (2) is made of a carbon-containing material, the inner wall of the reactor tube (2) is preferred to be coated or lined with materials such as silicon, silica, quartz or silicon nitride. Then, the reactor tube (2) may be structured in a multi-layered form. Therefore, the reactor tube (2) is of one-layered or multilayered structure in the thickness direction, each layer of which is made of a different material.

The selection of a sealing means (41a, 41b) may be important for the reactor tube (2) to be safely hold by the reactor shell (1). The sealing means are preferred to endure the high temperature of about 200° C. or above and may be selected from organic polymers, graphites, silicas, ceramics, metals or composite materials thereof. However, considering the vibration and thermal expansion during reactor operation, the sealing means (41a, 41b) may be installed not too firmly so that the possibility of cracking of the reactor tube (2) can be lowered during assembly, operation and disassembly.

The partition of the inner space of the reactor shell (1) by the reactor tube (2) may prevent the silicon particles (3) in the inner zone (4) from leaking into the outer zone (5) and differentiate the function and condition between the inner zone (4) and the outer zone (5).

During the silicon particle preparation step, the silicon particles (3) present in the inner zone (4) should be heated to a temperature required for silicon deposition by the heating means (8a, 8b) equipped at the inner zone (4) and/or the outer zone (5). One or a plurality of heating means (8a, 8b) may be installed in the inner zone (4) and/or the outer zone (5) in various manners. For example, a heating means may be installed only in the inner zone (4) or in the outer zone (5) as illustrated in FIG. 6 in a comprehensive manner. Meanwhile, a plurality of heating means may be installed in both zones, or only in the outer zone 5 as illustrated in FIG. 7. Besides, although not illustrated in Drawings, a plurality of heating means (8a, 8b) may be installed only in the inner zone (4). Otherwise, a single or a plurality of heating means may be installed in the outer zone 5 only.

Electrical energy is supplied to the heating means (8a, 8b) by an electric energy supplying means (9a-9f) installed as coupled with the reactor shell (1). The electric energy supplying means (9), which connects the heating means (8a, 8b) in the reactor with an electric source (E) located outside the reactor, may comprise various types of electrically conducting materials as followings: (i) a well conducting metallic material in the form of a cable, a bar, a rod, a shaped body, a socket, a coupler, etc.; a graphite, a ceramic (e.g., silicon carbide), a metal or a mixture thereof in the form of various electrodes that connect the power lines from the electric source (E) with the heating means. Alternatively, the electric energy supplying means can be prepared by extending a part of the heating means (8a, 8b). In combining the electric energy supplying means (9a-9f) with the reactor shell (1), electrical insulation is also important besides the mechanical sealing for preventing gas leak. Further, it is desirable to cool down the electric energy supplying means (9) by using a circulating cooling medium such as water, oil, or gas, etc., in order to prevent overheating caused by heat transfer from the heating means (9) or spontaneous generation and accumulation of heat.

During the silicon particle preparation step of the present invention, the fluidized bed of the silicon particles (3), which are moved by gas flow, is formed inside the reactor tube (2), at least in the reaction zone ($Z_r$), and silicon deposition occurs on the surface of the fluidizing silicon particles resulting in preparation of silicon particles, i.e., granular silicon product. For this purpose, it is required that a fluidizing gas supplying means (14, 14') which supplies the fluidizing gas (10) to the bed of silicon particles and a reaction gas supplying means (15r) which supplies the silicon-containing reaction gas (11r) are installed as coupled with the reactor shell (1b).

An etching gas supplying means (15e) may be installed at the fluidized bed reactor, as illustrated in FIG. 4 and FIG. 5. Alternatively, the reaction gas supplying means (15r) may be used to supply the etching gas (11e) during the silicon deposit removal step, as illustrated in FIG. 2 and FIG. 3.

The reaction gas supplying means (15r) may have a simple structure, as illustrated in FIGS. 2-7. But, because the reaction gas (11r) is sensitive to high temperature, various and complicated structures may be adopted [see U.S. Pat. No. 5,810,934 (1998); U.S. Pat. No. 6,541,377 (2003)].

When the reaction gas supplying means (15r) is used to supply the etching gas (11e) during the silicon deposit removal step, the reaction gas (11r) and the etching gas (11e) may be rendered to pass the same paths or nozzles, as illustrated in FIG. 2, FIG. 3, FIG. 6 and FIG. 7. Alternatively, the reaction gas supplying means (15r) may have a plurality of gas paths or nozzles, so that the reaction gas (11r) and the etching gas (11e) can pass through different paths or nozzles.

Each of the fluidizing gas supplying means (14, 14') and the reaction gas supplying means (15r) may be composed of such components as a tube or nozzle, a chamber, a flange, a fitting, a gasket, etc. Especially, the components which may contact the silicon particles (3) inside the reactor shell (1), particularly at the lower part of the inner zone (4), are preferably composed of a tube, a liner or a shaped body made of the inorganic material used to make the reactor tube (2).

Further, at the lower part (4a) of the fluidized bed of silicon particles inside the reactor inner zone (4), a gas distributing means (19), which distributes the fluidizing gas (10), is preferably equipped along with the fluidizing gas supplying means (14, 14') and the reaction gas supplying means (15r). The gas distributing means (19) may be in the form of a multi-hole or porous distribution plate, a packing material (22), a nozzle, a gas distributor shaped body or a combination thereof, without being limited to a specific form. The components of the gas distributing means (19) which may contact the silicon particles (3), e.g., its upper surface, are preferably made of an inorganic material used to make the reactor tube (2).

The reaction gas outlet of the reaction gas supplying means (15r), which introduces or injects the reaction gas (11r) into the fluidized bed, is preferably positioned higher than the upper surface of the gas distributing means (19), in order to prevent silicon deposition on the upper surface of the gas distributing means (19).

During the silicon particle preparation step, the fluidizing gas (10), required to form the fluidized bed of the silicon particles (3) at least in the reaction zone ($Z_r$), may be supplied in a variety of ways, depending on the construction of the fluidizing gas supplying means (14, 14'). For example, the fluidizing gas (10) may be supplied by a fluidizing gas supplying means (14, 14') comprising a gas chamber (14') is formed below a plate-type gas distributing means (19) and is coupled with the reactor shell (1), as illustrated in FIGS. 4, 5 and 6. Alternatively, as illustrated in FIG. 4 and FIG. 5, the fixed bed of the packing materials (22), which is not moved by the fluidizing gas (10), may be utilized as a part of the gas distributing means. As another example, as illustrated in FIG. 7, a fluidizing gas (10) may be supplied by a fluidizing gas supplying means (14) coupled with the reactor shell (1) so that one or a plurality of fluidizing gas nozzle outlet may be positioned in between the gas distributing means (19) that comprises a fixed bed of packing materials that will not be contained in the fluidizing granular silicon product (3b). Meanwhile, the gas distributing means (19) may comprise at least two components selected from a distribution plate, a nozzle, packing materials (22) and a gas distributor shaped body. For example, in addition to the fluidizing gas supplying distribution plate and/or nozzle, the gas distributing means (19) may comprise the fixed bed of the packing materials (22) other than the silicon particles (3) to be contained in the silicon product particles (3b).

The packing materials (22) have such a large size or sufficient unit mass as not to be moved by the flow of the fluidizing gas (10). They may have the shape of a sphere, an oval, a pellet, a nugget, a tube, a rod or a ring. Preferably, the packing material (22) is a high purity silicon material, having an average diameter in the range of from 5 to 50 mm and an average unit weight of at least about 5-10 times that of an average-sized silicon particle (3), or an inorganic material that can be used for or layered on the reactor tube (2).

In case the fixed bed of the packing material (22) which is not mobile by the flow of the fluidizing gas (10) constitutes the gas distributing means (19), the fixed bed is preferably formed at a height lower than the reaction gas outlet of the reaction gas supplying means (15r), that is, at the lower part of the heating zone ($Z_h$). Once the fixed bed is formed in the heating zone ($Z_h$), movement of the silicon particles and flow of the fluidizing gas may occur through the space between the packing materials (22). But, there is an advantage that the heat transferred from the bed of the silicon particles (3) heated by the heating means (8a, 8b) downward to the lower part of the reactor may be utilized for pre-heating the fluidizing gas (10).

During the silicon particle preparation step, the fluidizing silicon particles (3) heated directly or indirectly by the heating means (8a, 8b) can contact and be exposed to the reaction gas (11r) supplied by the reaction gas supplying means (15r) while residing temporarily or over a substantial period of time or with a regular or irregular fluctuating frequency in the reaction zone ($Z_r$). This results in silicon deposition on the surface of the fluidizing silicon particles and production of granular polycrystalline silicon. At the same time, silicon deposition occurs on the inner wall of the reactor tube (2), which encompasses the reaction zone ($Z_r$) and contacts the hot silicon particles (3) and reaction gas (11r), and is accumulated thereon to form a silicon deposit (D), which increases in thickness and volume as time passes.

Not only during the silicon particle preparation step, but also during the silicon particle partial discharging step, silicon deposit removal step and/or silicon particle replenishing step, the gas distributing means (19) and the fluidizing gas supplying means (14) enable supply of the fluidizing gas (10) to the inner zone (4), particularly to the heating zone ($Z_h$). However, unlike the silicon particle preparation step, it is not necessary to supply the fluidizing gas (10) in large quantity during the other steps, because the silicon particles need not always be maintained fluidized in the inner zone (4).

For continuous production of silicon particles, it is preferable to discharge or withdraw a part of the silicon particles prepared during the silicon particle preparation step from the inner zone (4) of the fluidized bed reactor and replenish silicon seed crystals (3a) to the inner zone (4) in order to maintain the number and average particle diameter of the silicon particles (3) as constant as possible in the inner zone (4).

Therefore, a particle discharging means (16) for discharging the polycrystalline silicon particles needs to be installed as coupled with the reactor shell (1). The discharge pipe of the particle discharging means (16) may be assembled along with the reaction gas supplying means (15r) as in FIG. 6 or may be installed independently of the reaction gas supplying means (15r) as in FIG. 4, 5 or 7, so that the silicon particles (3b) can be discharged from the inner zone (4) at the right time, continuously, periodically or intermittently. Alternatively, an independent space may be coupled with the reactor shell (1), so that the silicon particles (3b) can be cooled before being discharged out of the reactor, while remaining at a part or at the bottom of the space of the fluidizing gas supplying means (14') as shown in FIG. 6. A part of the silicon particles discharged from the inner zone (4) during the silicon particle preparation step, or the silicon product particles (3b), may be transferred to a polycrystalline silicon product storage means or handling means directly connected with the reactor.

Of the silicon product particles (3b) produced during the silicon particle preparation step, the small sized ones can be readily utilized as seed crystals (3a). Accordingly, it is also possible to transfer the silicon product particles (3b) discharged from the inner zone (4) to a classifying means that can classify the particles depending on size, in order to transfer large particles to the polycrystalline silicon product storage means or handling means and use small particles as seed crystals (3a).

Further, the silicon particles (3b) are preferably cooled while being discharged by the particle discharging means (16) because the reactor inner zone (4) or the fluidized bed (4a) of silicon particles is hot. For this purpose, hydrogen, nitrogen, argon, helium or other gas may be flown through the particle discharging means (16) or a cooling medium such as water, oil, gas, etc., may be circulated along the wall of the particle discharging means (16). Besides, although not shown in drawings, the particle discharging means (16) may be equipped as coupled with the inside of the reactor shell (1) (e.g., 14' of FIG. 6) or the bottom of the reactor shell (e.g., 1b of FIG. 6 or FIG. 7) in order to provide a sufficient space, so that the silicon particles (3b) are discharged out of the fluidized bed reactor after being sufficiently cooled while remaining in the fluidized bed (4a).

It is required to prevent the silicon product particles (3b) from being contaminated by impurities while they are discharged out of the reactor by the particle discharging means (16). Thus, it is preferable to construct the components of the particle discharging means (16), which can be exposed to or contact the hot silicon product particles (3b), in the form of a tube, a liner or a shaped body made of the inorganic material that may be used for the reactor tube (2).

Such components of the particle discharging means (16) need to be fixed as coupled with the reactor shell (1) and/or a protection tube made of a metallic material. Instead of the inorganic material, the components of the particle discharging means (16), which contact substantially cooled silicon particles or the wall of which can be cooled by a cooling medium, may consists of a tube, a liner or a shaped body made of a metallic material coated or lined with a fluorine-containing polymer material on the inner wall.

As described above, the silicon product particles (3b) may be discharged continuously, periodically or intermittently from the reactor inner zone (4) to the polycrystalline silicon product storage means or handling means by the particle discharging means (16).

It is also possible to equip the classifying means between the reactor and the product storage means to classify the silicon product particles (3b) depending on size and utilize small particles as seed crystals (3a).

A variety of industrially available particle separation devices may be used or modified for the classifying means. But, in order to prevent contamination during the separation of the particles, the components of the classifying means that contact the silicon product particles (3b) is preferably made of a material used in the particle discharging means (16) or a pure polymeric material with no additive or filler added.

As well as in the silicon particle preparation step, the particle discharging means (16) may be also utilized in the silicon particle partial discharging step as a means of discharging a part of the silicon particles (3) from the inner zone (4), so that the height of the bed of the remaining silicon particles (3) cannot exceed that of the outlet of the reaction gas supplying means (15r). Alternatively, without requiring the supply of the reaction gas (11r), the partial discharging step can also be performed by discharging a part of the silicon particles (3) from the inner zone (4) through the reaction gas supplying means (15r) on behalf of the particle discharging means (16). In this case, although not shown in drawings, a container for temporarily storing the silicon particles (3) may be equipped at the bottom of the reaction gas supplying means (15r), so that the silicon particles remaining in the reaction zone ($Z_r$) can fall into the container with an appropriate amount of an inert gas, instead of the reaction gas (11r), being supplied into the inner zone (4). Meanwhile, part of the silicon particles (3) remaining in the inner zone (4) may be discharged to the container through the reaction gas supplying means (15r) by supplying the fluidizing gas (10) to the heating zone ($Z_h$), so that the height of the bed of the silicon particles can be lowered down to a predetermined value.

For the continuous operation of the fluidized bed reactor during the silicon particle preparation step, it is required to couple the gas discharging means (17) with the reactor shell (1d) for discharging an off-gas (13), including the fluidizing gas being passed through the fluidized bed (4a), a non-reacted reaction gas and a byproduct gas, out of the fluidized bed reactor via the top of the inner zone (4c).

Fine silicon powders or high-molecular-weight reaction byproducts entrained by the off-gas (13) are separated by a off-gas treating means (34). The off-gas treating means (34), selected among a cyclone, a filter, a packing tower, a scrubber, a centrifuge, etc., may be equipped either outside of the reactor shell (1) or at the upper space (4c) of the inner zone within the reactor shell (1), as illustrated in FIG. 6 or FIG. 7. The silicon particles separated by the off-gas treating means (34) may be recycled to the fluidized bed (4a) in the inner zone of the reactor for use as seed crystals (3a) or may be utilized for other purposes.

The gas discharging means (17) enables discharging of the fluidizing gas (10), the inert gas supplied to the inner zone (4) and/or the gas components remaining in the inner zone (4) not only during the silicon particle preparation step, but also during the silicon particle partial discharging step, the silicon deposit removal step and the silicon particle replenishing step. Particularly, during the silicon deposit removal step, a mixture of a non-reacted etching gas, etching reaction ($R_e$) byproducts, and/or the fluidizing gas (10), etc., may be discharged by the gas discharging means (17).

For continuous preparation of silicon particles, it is preferable to maintain the number of silicon particles comprising the fluidized bed (4a) and the average particle size thereof within a certain range. Thus, it is preferred to replenish seed crystals (3a) into the fluidized bed (4a) roughly corresponding to the number of the silicon particles (3b) discharged as product. As described above, although the silicon particles or powders of an appropriate size separated by the off-gas treating means (34) can be used as seed crystal, the amount is restricted. Thus, a further preparation or manufacture of silicon seed crystals is inevitable for continuous production of silicon particles. In this regard, a way of separating small silicon particles from the product particles (3b) and utilizing them as seed crystals (3a) can be considered. However, the process of separating the seed crystals (3a) from the product particles (3b) outside the fluidized bed reactor is complicated and vulnerable to contamination by impurities.

Instead of separating product particles (3b), a classifying means may be equipped at the particle discharge path of the particle discharging means (16), so that small silicon particles can be recycled back into the fluidized bed (4a) by the gas flowing upward for cooling down the product particles (3b) during their discharge, thereby reducing the requirement of seed crystal supply, increasing the average particle size of the product particles (3b) and reducing particle size distribution in the product particles.

In general, silicon seed crystals are prepared by pulverizing some of the silicon product particles (3b) discharged by the particle discharging means (16) with a pulverizing apparatus. The seed crystals (3a) may be supplied continuously, periodically or intermittently at the right time into the reactor inner zone (4) through a seed crystal supplying means (18) installed as coupled with the reactor shell (1d), as illustrated in FIG. 6. This method is advantageous in that the size and feeding rate of the seed crystals (3a) can be adjusted as required. However, it is disadvantageous in that an independent pulverizing apparatus is required. Alternatively, the silicon particles may be pulverized into seed crystals inside the fluidized bed (4a) by using the reaction gas outlet nozzle of the reaction gas supplying means (15r) or an additionally installed gas nozzle for a high-speed gas jet inside the fluidized bed allowing particle pulverization. This method is economical because no additional pulverizing apparatus is required. However, it is disadvantageous in that it is difficult to control the size and rate of generation of the seed crystals.

The silicon particles discharged during the silicon particle partial discharging step may be contained in product particles (3b) or put aside and supplied to the inner zone (4) through the seed crystal supplying means (18) during the silicon particle replenishing step. Otherwise, instead of the silicon particles discharged during the silicon particle partial discharging step, the independently prepared silicon seed crystals (3a) may be supplied to the inner zone (4) through the seed crystal supplying means (18) during the silicon particle replenishing step.

During the silicon particle preparation step as described above, the inner zone (4) comprises all spaces required for forming the bed of silicon particles (3) wherein the fluidizing gas (10) and the reaction gas (11r) are supplied and silicon deposition occurs, and required for flowing and discharging of the off-gas (13) including the fluidizing gas, a non-reacted reaction gas and a byproduct gas. Therefore, the inner zone (4) plays an important role in producing polycrystalline silicon particles by silicon deposition in the fluidized bed of silicon particles (3).

In contrast, the outer zone (5) is an independently formed space in between the outer wall of the reactor tube (2) and the reactor shell (1), in which the bed of silicon particles (3) is not present and silicon deposition does not occur. Thus, the outer zone (5) as mentioned in this description is the space of the inner space of the reactor shell (1) excluding the inner zone (4) or is formed in between the reactor tube (2) and the reactor shell (1).

An inert gas is supplied to the outer zone (5) to maintain the outer zone under an inert gas atmosphere. The reason of maintaining the outer zone (5) under an inert gas atmosphere and several important roles of the outer zone (5) are as follows. First, the outer zone (5) provides a space for protecting the reactor tube (2), which is accomplished by maintaining a pressure difference between the inner zone (4) and the outer zone (5) within a certain range. Second, the outer zone (5)

provides a space for installing an insulation material (6) for preventing or reducing heat loss from the reactor. Third, the outer zone (5) provides a space for installing a heating means, if required, around the reactor tube (2) for heating the reactor, Fourth, the outer zone (5) provides a space for maintaining a substantially inert gas atmosphere outside the reactor tube (2) to prevent dangerous gas containing oxygen and impurities from being introduced into the inner zone (4), and for safely installing and maintaining the reactor tube (2) inside the reactor shell (1). Fifth, the outer zone (5) allows a real-time monitoring of the status of the reactor tube (2) during operation. The analysis or measurement of the outer-zone gas sample from the outer zone connection means (28, 28a, 28b) may reveal the presence or concentration of a gas component that may exist in the inner zone (4), the change of which may indirectly reveal an accident at the reactor tube. Sixth, as illustrated in FIG. 7, the outer zone (5) may provide a space for installing a heating means for heating the silicon deposit (D) accumulated on the inner wall of the reactor tube (2) so that the deposit can be removed rapidly by introducing an etching gas (11e) into the reaction zone (Zr). Lastly, the outer zone (5) facilitates assembly and disassembly of the reactor tube (2) and the inner zone (4).

Since the outer zone (5) plays various important roles, the space of the outer zone may be partitioned into several sections in an up-and-down and/or a radial or circumferential direction, utilizing one or more of tubes, plates, shaped bodies or fittings as partitioning means. When the outer zone (5) is further partitioned according to the present invention, the divided sections are preferred to spatially communicate with each other while having substantially the same atmospheric condition and pressure.

An insulation material (6), which may be installed in the outer zone (5) for greatly reducing heat transfer via radiation or conduction, may be selected from industrially acceptable inorganic materials in the form of a cylinder, a block, fabric, a blanket, a felt, a foamed product, or a packing filler material.

The heating means (8), which is connected to an electric energy supplying means (9) coupled with the reactor shell (1) for maintaining the reaction temperature in the fluidized bed reactor, may be installed either in the outer zone (5) or in the inner zone (4). Particularly, the heating means may be installed inside the bed of the silicon particles (3). If necessary, the heating means (8a, 8b) may be installed both in the inner zone (4) and the outer zone (5), as illustrated in FIG. 6. Alternatively, the heating means (8b) may be installed in the outer zone (5) only, as illustrated in FIG. 7. The whole or part of the heating means (8a, 8b) may be also utilized to heat the silicon deposit (D) directly or indirectly during the silicon deposit removal step.

When a plurality of heating means (8a, 8b) is installed in the fluidized bed reactor, they may be electrically connected to an electric source (E) in series and/or in parallel. Or, as illustrated in FIG. 6 or FIG. 7, the power supplying systems respectively comprising the electric source (E) and the electric energy supplying means (9a, 9b, 9c, 9d, 9e, 9f) may be constructed independently.

As illustrated in FIG. 6, if the heating means (8a) is installed inside the bed of silicon particles (3), the silicon particles can be directly heated in the inner zone (4). In this case, it is preferred that the heating means (8a) be positioned lower than the reaction gas outlet of the reaction gas supplying means (15r) in order to prevent silicon deposition on the surface of the heating means (8a) and its accumulation thereon.

Further, as schematically illustrated in FIG. 6 and FIG. 7, it is also preferred to supply an inert gas (12) comprising at least one substance selected from nitrogen, argon and helium to the outer zone (5) to maintain the outer zone (5) under an inert gas atmosphere. Preferably, this manipulation is performed in all steps of the silicon deposition cycles in accordance with the present invention. For this purpose, it is required to install an inert gas connection means (26a, 26b) at the reactor shell (1), as illustrated in FIG. 6 and FIG. 7, to maintain the outer zone (5) under an inert gas atmosphere, without regard to the silicon deposition reaction (Rd) or etching reaction ($R_e$) occurring in the inner zone (4). The inert gas connection means (26a, 26b), which is installed at, on or through the reactor shell (1) and is spatially connected with the outer zone (5), has the function of piping connection for supply or discharge of the inert gas (12). It may be in the form of a tube, a nozzle, a flange, a valve, a fitting, etc., or a combination thereof.

Independently of the inert gas connection means (26a, 26b), an outer zone connection means (28, 28a, 28b) may also be installed at the part of the reactor shell (1) spatially exposed directly or indirectly to the outer zone (5), being used for measurement and/or control of flow rate, temperature, pressure and/or gas composition.

The outer zone (5) can be maintained under an inert gas atmosphere with a single inert gas connection means. However, two or more inert gas connection means (26a, 26b) may be used to perform the supply and discharge of the inert gas independently. In addition to maintaining the outer zone (5) under an inert gas atmosphere, the inert gas connection means (26a, 26b) may be utilized for measurement and/or control of flow rate, temperature, pressure, and/or gas composition, which may also be performed using the outer zone connection means (28, 28a, 28b).

As illustrated in FIG. 6 and FIG. 7 in a comprehensive way, it is possible to measure or control the pressure ($P_o$) at the outer zone (5) using the inert gas connection means (26a, 26b) or the outer zone connection means (28, 28a, 28b). The outer zone connection means (28, 28a, 28b), which may be installed independently of the inert gas connection means (26a, 26b), is installed for measurement and/or control the maintenance of the outer zone (5). The outer zone connection means (28, 28a, 28b) may also be in the form of a tube, a nozzle, a flange, a valve, a fitting, etc. or a combination thereof. In the absence of the inert gas connection means (26a, 26b), the outer zone connection means (28, 28a, 28b) may be utilized for the supply or discharge of the inert gas (12), in addition to the measurement and/or control of temperature, pressure and/or gas composition. Therefore, it is not necessary to differentiate the inert gas connection means (26a, 26b) from the outer zone connection means (28, 28a, 28b) in respect of shape and function.

In contrast with the outer zone (5), where the pressure can be maintained almost constant irrespective of location and time, the inner zone (4) has a different pressure at a different height of the fluidized bed of the silicon particles (3). Thus, the pressure ($P_i$) of the inner zone (4) is different depending on the location. Although the pressure drop imposed by the fluidized bed of solid particles depends on the height of the fluidized bed, it is common to maintain the pressure drop by fluidized bed less than about 0.5-1 bar unless the height of the fluidized bed is extremely high. Further, irregular fluctuation of the pressure is inevitable with time due to the nature of the fluidization of solid particles. Thus, pressure may vary in the inner zone (4) depending on location and time.

Considering these natures, the pressure controlling means for the inner pressure, i.e., the inner pressure controlling means for directly or indirectly measuring and/or controlling pressure (Pi) in the inner zone (4) may be installed at such a point among various locations that it may be spatially connected to the inner zone (4). Pressure controlling means according to the present invention, i.e., the inner pressure controlling means and the outer pressure controlling means may be installed on or through various positions depending on the details of the reactor assembly as well as on the operational parameters to be controlled. The inner pressure controlling means may be spatially connected to the inner zone (4) through the inner zone connection means (24, 25) or the fluidizing gas supplying means (14) or the reaction gas supplying means (15r) or the particle discharging means (16) or the gas discharging means (17), etc., which are spatially exposed directly or indirectly to the inner zone (4). Meanwhile, the pressure controlling means for the outer pressure, i.e., the outer pressure controlling means may be spatially connected to the outer zone (5) through the outer zone connection means (28, 28a, 28b) or the inert gas connection means (26a, 26b), etc., which are installed on or through the reactor shell (1) and spatially exposed to the outer zone (5) directly or indirectly.

The inner pressure controlling means and/or the outer pressure controlling means may be in the form of at lest one selected from (i) a connection pipe or fitting for spatial connection; (ii) a manual, semi-automatic or automatic valve; (iii) a digital- or analog-type pressure gauge or differential-pressure gauge; (iv) a pressure indicator or recorder; (v) an element constituting a controller with a signal converter or an arithmetic processor.

The inner pressure controlling means and/or the outer pressure controlling means may be connected with each other in the form of a mechanical assembly or a signal circuit. Further, either of the pressure controlling means may be partially or completely integrated with a control system selected from the group consisting of a central control system, a distributed control system and a local control system.

Although the inner pressure controlling means and outer pressure controlling means may be independently constituted in terms of pressure, either of the pressure controlling means may be partially or completely integrated with a means for measuring or controlling a parameter selected from the group consisting of flow rate, temperature, gas composition, particle concentration, etc. Meanwhile, either of the controlling means may further comprise a separation device such as a filter or a scrubber for separating particles, or a container for pressure damping. This protects the component of the pressure controlling means from contamination by impurities, and also provides a means to damp pressure changes.

As an example, the inner pressure controlling means may be installed at or connected to the inner zone connecting means (24, 25) that is installed on or through the reactor shell (1) spatially exposed directly or indirectly to an inner zone (4) for measurement of pressure, temperature or gas component or for viewing inside the reactor. By constructing the inner pressure controlling means so that it may be connected to the inner zone connecting means (24, 25), pressure in the upper part of the inner zone (4c) may be stably measured and/or controlled although it is difficult to detect the time-dependent pressure fluctuation due to the fluidized bed of silicon particles. For more accurate detection of the time-dependent pressure fluctuation related with the fluidized bed, the inner zone connecting means may be installed so that it may be spatially connected to the inside of the fluidized bed. The inner pressure controlling means may also be installed at or connected to other appropriate positions, i.e., a fluidizing gas supplying means (14) or a reaction gas supplying means (15r) or a particle discharging means (16) or a gas discharging means (17), etc., all of which are coupled with the reactor shell (1) thus being spatially connected to the inner zone (4). Further, a plurality of inner pressure controlling means may be installed at two or more appropriate positions that can be spatially connected with the inner zone connecting means (24, 25) and/or the inner zone (4).

As mentioned above, the presence of silicon particles affects the inner pressure, Pi. Thus, the measured value of Pi varies according to the position where the inner pressure controlling means (30) is installed. According to the experimental observations by the present inventors, the value of Pi is influenced by the characteristics of the fluidized bed and by the structure of a fluidizing gas inlet means (14) or a reaction gas supplying means (15r) or a particle discharging means (16) or a gas discharging means (17), but its positional deviation according to pressure measurement point is not greater than 1 bar. Accordingly, the pressure difference between the pressure (Po) at the outer zone (5) and the pressure (Pi) at the inner zone (4) needs to be maintained within 1 bar, i.e., the condition of 0 bar $\leqq |Po-Pi| \leqq 1$ bar needs to be satisfied, following the steps of: measuring and/or controlling the pressure at the inner zone (4) directly or indirectly with the inner pressure controlling means; measuring and/or controlling the pressure at the outer zone (5) directly or indirectly with the outer pressure controlling means; and controlling the pressure difference between the outer zone (5) and the inner zone (4) by a pressure-difference controlling means.

As a preferred embodiment of the present invention, the outer pressure controlling means for measuring and/or controlling the pressure at the outer zone (5) directly or indirectly needs to be installed at an appropriate position selected so that it is spatially connected with the outer zone (5). The position where the outer pressure controlling means may be connected or installed includes, for example, at the outer zone connection means (28, 28a, 28b) or the inert gas connection means (26a, 26b), which are installed at the reactor shell (1) spatially exposed to the outer zone (5) directly or indirectly. Since the outer zone (5) needs to be maintained under an inert gas atmosphere, the inert gas inlet (26a) for supplying the inert gas (12) to the outer zone (5) and the inert gas outlet (26b) for discharging the inert gas (12) from the outer zone (5) can be utilized as the inert gas connection means (26a, 26b) or the outer zone connection means (28, 28a, 28b). The inert gas inlet (26a) and the inert gas outlet (26b) may be installed independent of the connection means (26, 28) or may be coupled with a single connection means in the form of a double pipe. Accordingly, it is also possible to install the outer pressure controlling means for measuring and/or controlling the pressure at the outer zone (5) directly or indirectly, so that it is spatially connected to the outer zone (5) through the inert gas connection means (26a, 26b) or the outer zone connection means (28, 28a, 28b) comprising the inert gas inlet (26a) or the inert gas outlet (26b).

Preferably, the difference of the pressure ($P_o$) at the outer zone (5) and the pressure ($P_i$) at the inner zone (4), i.e., the pressure difference between both sides of the reactor tube (2), $|P_o-P_i|$, is maintained satisfying the condition of 0 bar $\leqq |Po-Pi| \leqq 1$ bar for continuous operation of the fluidized bed reactor even under a high reaction pressure. During each silicon deposition cycle by the present invention which comprises (i) the silicon particle preparation step; (ii) the silicon particle partial discharging step; (iii) the silicon deposit removal step; and (iv) the silicon particle replenishing step, the pressure at the inner zone (4) may vary in the range of from 1 to 20 bar. But, as long as the pressure difference between both sides of the reactor tube (2) is maintained less than 1 bar, mechanical problem imposed on the reactor tube (2) caused by the silicon deposit (D) can be reduced significantly. If the pressure difference between both sides of the reactor tube (2) is maintained less than 1 bar, the silicon deposition reaction (Rd) and/or the etching reaction ($R_e$) can be carried out under a high reaction pressure. Consequently, the productivity of the fluidized bed reactor can be maximized through repeated silicon deposition cycles and the physical stability of the reactor tube (2) can be improved throughout the cycles because the physical load against the reactor tube (2) caused by the silicon deposit (D) accumulated during the silicon particle preparation step can be reduced.

The inner pressure controlling means and/or the outer pressure controlling means are equipped at the fluidized bed reactor for this reason. Preferably, the $|P_o-P_i|$ value needs to be maintained as small as possible, considering that the $P_i$ value may differ according to the steps constituting each silicon deposition cycle and depending on the height of the inner zone (4).

Industrial Applicability

As apparent from the foregoing description, the method for preparation of polycrystalline silicon using a fluidized bed reactor in accordance with the present invention provides the following advantages.

1) Since the silicon deposit formed during the silicon deposition can be easily removed from the inner wall of the reactor tube periodically, with little influence on the preparation of granular polycrystalline silicon, especially without the need of disassembling the reactor, the productivity of the fluidized bed reactor can be improved significantly without deteriorating the mechanical stability of the reactor.

2) The time required for the silicon deposit removal step can be significantly reduced compared with the time required for the silicon particle preparation step and the manipulation of the reactor required for repeating the silicon deposition cycles can be much simplified.

3) Since the present invention is applicable to any type of fluidized bed reactor in which the bed of silicon particles is divided into the reaction zone and the heating zone with the height of the outlet of the reaction gas supplying means as reference height, it is widely applicable to preparation of granular polycrystalline silicon.

4) The present invention enables a large-scale production of granular polycrystalline silicon using a fluidized bed reactor.

5) Since the pressure difference between inside and outside of the reactor tube can be maintained as small as possible, the mechanical stability of the reactor tube can be maintained even at a high pressure, regardless of the accumulation of silicon deposit. Also, the damage of the reactor tube caused by the pressure difference between both sides of the reactor tube can be prevented fundamentally.

6) Because the inert gas needs not to be supplied to the outer zone of the reactor continuously in large quantity, the pressure difference between both sides of the reactor tube can be maintained within a certain range at a low cost.

7) The reaction temperature required for the preparation of polycrystalline silicon can be attained with the silicon particle heating means.

8) Minimizing impurity contamination during silicon particle preparation step, the present invention enables high purity polycrystalline silicon to be manufactured economically with good productivity and energy efficiency.

Those skilled in the art will appreciate that the concepts and specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the present invention as set forth in the appended claims.

What is claimed is:

1. A method for preparation of polycrystalline silicon using a fluidized bed reactor wherein the fluidized bed reactor comprises a reactor tube in which a bed of silicon particles is formed and upper and lower spaces in the reactor tube are respectively defined as a reaction zone provided for silicon deposition by a silicon-containing reaction gas and a heating zone provided for heating the silicon particles, and which comprises:

a silicon particle preparation step, wherein the reaction gas is supplied so that silicon deposition occurs on surfaces of the silicon particles in contact with the reaction gas, while silicon deposit is accumulated on an inner wall of the reactor tube;

a silicon particle partial discharging step that follows the silicon particle preparation step, wherein, without requiring the supply of the reaction gas, a part of the silicon particles remaining inside the reactor tube is discharged out of the fluidized bed reactor so that the height of the bed of the silicon particles does not exceed the height of a reaction gas outlet;

a silicon deposit removal step that follows the silicon particle partial discharging step, wherein, without requiring the supply of the reaction gas, the silicon deposit is removed by supplying an etching gas into the reaction zone; and a silicon particle replenishing step that follows the silicon deposit removal step, wherein silicon particles are replenished into the reactor tube.

2. The method for preparation of polycrystalline silicon using a fluidized bed reactor as set forth in claim 1, wherein a cycle comprising the silicon particle preparation step, the silicon particle partial discharging step, the silicon deposit removal step and the silicon particle replenishing step is repeated.

3. The method for preparation of polycrystalline silicon using a fluidized bed reactor as set forth in claim 1, wherein the fluidized bed reactor comprises a reactor shell which encompasses the reactor tube, and an inner space of the reactor tube is defined as an inner zone where the bed of silicon particles is present and the heating zone and the reaction zone are included, while the space between the reactor tube and the reactor shell is defined as an outer zone where the bed of silicon particles is not present and silicon deposition does not occur.

4. The method for preparation of poly crystalline silicon using a fluidized bed reactor as set forth in claim 3, wherein the silicon particle preparation step comprises the sub-steps of:

supplying a fluidizing gas to the bed of silicon particles in the heating zone so that the bed of silicon particles formed in the reaction zone becomes fluidized;

heating the silicon particles;

discharging a part of the silicon particles prepared in the inner zone out of the fluidized bed reactor; and discharging an off-gas comprising the fluidizing gas, which passes through the bed of silicon particles, a non-reacted reaction gas and a byproduct gas out of the fluidized bed reactor.

5. The method for preparation of polycrystalline silicon using a fluidized bed reactor as set forth in claim 4, wherein the fluidizing gas comprises at least one substance selected from hydrogen, nitrogen, argon, helium, silicon tetrachloride, trichlorosilane, dichlorosilane and hydrogen chloride.

6. The method for preparation of polycrystalline silicon using a fluidized bed reactor as set forth in claim 4, wherein a fixed bed of packing materials that are not fluidized by the fluidizing gas is formed in addition to the bed of silicon particles at a lower space of the heating zone.

7. The method for preparation of polycrystalline silicon using a fluidized bed reactor as set forth in claim 4 wherein, in the silicon deposit removal step, an etching-step off-gas including the fluidizing gas being passed through the bed of silicon particles, a non-reacted etching gas and/or an etching reaction product gas is discharged out of the fluidized bed reactor.

8. The method for preparation of polycrystalline silicon using a fluidized bed reactor as set forth in claim 3, wherein an inert gas is supplied to the outer zone.

9. The method for preparation of polycrystalline silicon using a fluidized bed reactor as set forth in claim 3, wherein the difference of the pressure at the outer zone (Po) and the pressure at the inner zone (Pi) is maintained satisfying the condition of $0 \text{ bar} \leq |Po-Pi| \leq 1 \text{ bar}$.

10. The method for preparation of polycrystalline silicon using a fluidized bed reactor as set forth in claim 1, wherein the etching gas comprises at least one chlorine-containing substance selected from silicon tetrachloride ($SiCl_4$), hydrogen chloride (HCl) and chlorine ($Cl_2$).

11. The method for preparation of polycrystalline silicon using a fluidized bed reactor as set forth in claim 10, wherein the etching gas further comprises at least one substance selected from hydrogen, nitrogen, argon and helium.

12. The method for preparation of polycrystalline silicon using a fluidized bed reactor as set forth in claim 1, wherein, in the silicon particle preparation step and/or the silicon deposit removal step, the absolute pressure at the reaction zone is maintained at in the range of 1-20 bar.

13. The method for preparation of polycrystalline silicon using a fluidized bed reactor as set forth in claim 1, wherein the silicon deposit removal step comprises removing the silicon deposit formed at an end of the reaction gas outlet using the etching gas.

14. The method for preparation of polycrystalline silicon using a fluidized bed reactor as set forth in any of claim 1, wherein the silicon deposit removal step is carried out by supplying the etching gas using a reaction gas supplying part of the fluidized bed reactor and/or an etching gas supplying part of the fluidized bed reactor, the outlet of the etching gas supplying part being exposed to the reaction zone.

15. The method for preparation of polycrystalline silicon using a fluidized bed reactor as set forth in claim 14, wherein, in the silicon deposit removal step, a fluidizing gas is supplied to the bed of silicon particles remained in the heating zone so that the bed of the silicon particles is maintained as a fixed bed in which the silicon particles become immobile or as a fluidized bed in which a part of the silicon particles remains fluidized.

16. The method for preparation of polycrystalline silicon using a fluidized bed reactor as set forth in claim 1 wherein the reaction gas comprises at least one silicon-containing substance selected from monosilane ($SiH_4$), dichlorosilane ($SiH_2Cl_2$), trichlorosilane ($SiHCl_3$) and silicon tetrachloride ($SiCl_4$).

17. The method for preparation of polycrystalline silicon using a fluidized bed reactor as set forth in claim 1, wherein, in the silicon deposit removal step, the temperature of a part of the silicon deposit is maintained within the range of 500-1,250° C.

18. The method for preparation of polycrystalline silicon using a fluidized bed reactor as set forth in claim 1, wherein, in the silicon deposit removal step, the silicon deposit is heated by a heater equipped at the inner zone of the reactor tube and/or at the outer zone.

19. The method for preparation of polycrystalline silicon using a fluidized bed reactor as set forth in claim 1, the reaction gas outlet that supplies the silicon-containing reaction gas is located inside of the bed of silicon particles and, with the outlet end as the reference height, the upper and lower spaces are respectively defined as the reaction zone and the heating zone.

\* \* \* \* \*